(12) United States Patent
Hara et al.

(10) Patent No.: US 6,255,148 B1
(45) Date of Patent: Jul. 3, 2001

(54) POLYCRYSTAL THIN FILM FORMING METHOD AND FORMING SYSTEM

(75) Inventors: Akito Hara, Kawasaki; Kuninori Kitahara, Matsue, both of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/327,572

(22) Filed: Jun. 8, 1999

(30) Foreign Application Priority Data

Jul. 13, 1998 (JP) .................................................. 10-197316
Dec. 7, 1998 (JP) .................................................. 10-346879

(51) Int. Cl.[7] .................................................. H01L 21/00
(52) U.S. Cl. .................................................. 438/166; 438/171
(58) Field of Search .................................. 156/610; 427/53.1; 430/939 S; 148/DIG. 3; 438/166, 171; 117/108, 7

(56) References Cited

U.S. PATENT DOCUMENTS

| | | | |
|---|---|---|---|
| 4,608,117 | * 8/1986 | Ehrlich et al. .................. | 156/610 |
| 4,617,237 | * 10/1986 | Gupta et al. .................... | 428/446 |
| 4,843,030 | * 6/1989 | Eden et al. ...................... | 437/88 |
| 4,898,748 | * 2/1990 | Kruger, Jr. ...................... | 427/38 |
| 5,395,804 | * 3/1995 | Ueda ............................... | 437/233 |
| 5,561,088 | * 10/1996 | Sameshina ...................... | 437/247 |

* cited by examiner

*Primary Examiner*—Richard Elms
*Assistant Examiner*—Michael K. Lebentritt
(74) *Attorney, Agent, or Firm*—Armstrong, Westerman, Hattori, McLeland & Naughton, LLP

(57) ABSTRACT

A polycrystal thin film forming method comprising the step of forming a semiconductor thin film on a substrate 14, and the step of flowing a heated gas to the semiconductor thin film while an energy beam 38 is being applied to the semiconductor thin film at a region to which the gas is being applied to thereby melt the semiconductor film, and crystallizing the semiconductor thin film in its solidification. The energy beam is applied while the high-temperature gas is being flowed, whereby the melted semiconductor thin film can have low solidification rate, whereby the polycrystal thin film can have large crystal grain diameters and can have good quality of little defects in crystal grains and little twins.

10 Claims, 26 Drawing Sheets

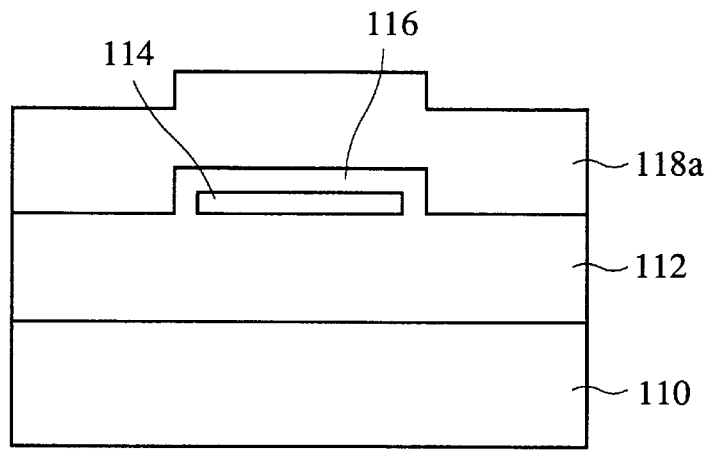
FIG. 14A
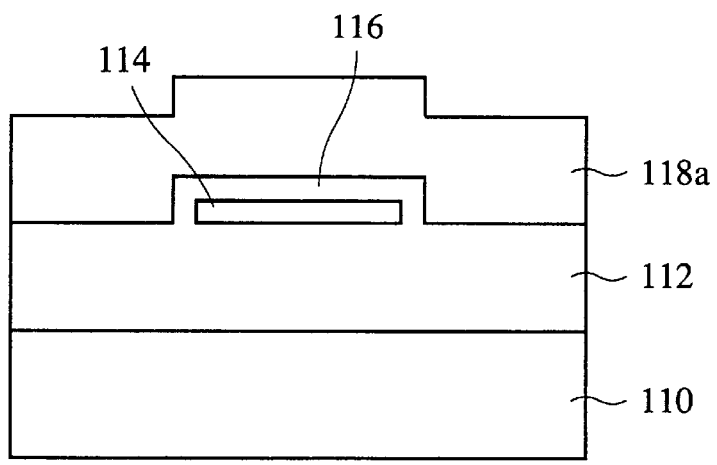
FIG. 14B

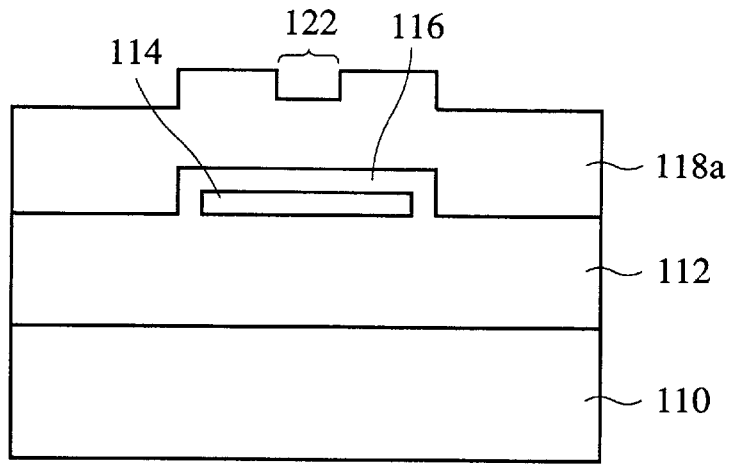
FIG. 19A
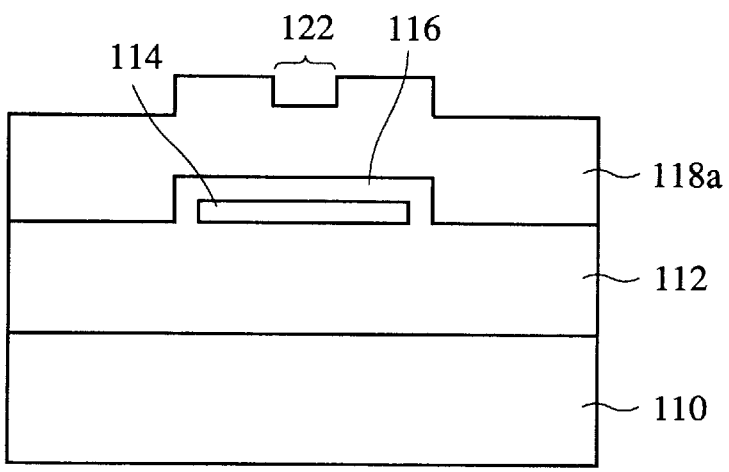
FIG. 19B
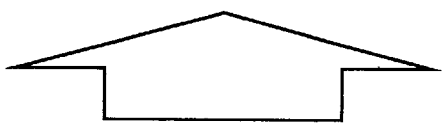

POLYCRYSTAL THIN FILM FORMING METHOD AND FORMING SYSTEM

BACKGROUND OF THE INVENTION

The present invention relates to a polycrystal thin film forming method and forming system, more specifically a polycrystal thin film forming method and forming system for forming at low temperature polycrystal thin film on a substrate of low heat resistance temperature.

Furthermore, the present invention relates to a polycrystal silicon thin film forming method, a thin film transistor fabrication method and a liquid crystal display device fabrication method, more specifically a polycrystal silicon thin film forming method which can form polycrystal silicon thin film on a substrate having low heat resistance temperature, a thin film transistor fabrication method for fabricating a thin film transistor using the polycrystal silicon thin film, and a liquid crystal display device for fabricating a liquid crystal display device using the thin film transistor.

Recently, liquid crystal displays (LCDs) using thin film transistors (TFTs) as switch devices for the picture elements because of electric power saving, space saving, high response speed, beautiful display, etc.

Such liquid crystal displays generally use glass substrates, and the thin film transistors are formed on the glass substrate. The channel layers of the thin film transistors are formed of, in many cases, polycrystal silicon thin film.

As a method for forming polycrystal silicon thin film on a glass substrate has been conventionally known a method in which amorphous silicon thin film is formed on a glass substrate and then is subjected to a heat treatment at 600° C. for 50 hours to crystallize the amorphous silicon thin film, and polycrystal silicon thin film is formed. In this method nuclei of crystals are grown at the initial stage of the heat treatment, and the nuclei are grown to form polycrystal silicon thin film.

However, in this polycrystal silicon thin film forming method the heat treatment performed at 600° C. for about 50 hours deforms the glass substrate. Furthermore, crystal grain of the thus-formed polycrystal silicon thin film have many defects and twins. Thus this method has found it difficult to form high-quality polycrystal silicon thin film having high electron mobility.

It was considered to form polycrystal silicon thin film on a glass substrate at an above 600° C. high temperature by CVD (Chemical Vapor Deposition), but the glass substrate was deformed by the high temperature of above 600° C., and the thus-formed polycrystal silicon thin film could not have sufficient crystallization.

Then is proposed a method in which amorphous silicon thin film is formed on a glass substrate, and laser beams are applied to the amorphous silicon thin film to form polycrystal silicon thin film. In this method polycrystal silicon thin film is formed in the process of the silicon melted by the laser beams solidifying. The amorphous silicon thin film is melted by the laser beams for a short period of time without heating the glass substrate to a high temperature. Accordingly polycrystal silicon thin film can be formed without deforming the glass substrate.

However, in this proposed polycrystal silicon thin film forming method because silicon solidifies at high speed, polycrystal silicon thin film having large crystal grain diameters cannot be formed. Thin film transistors using the thus-formed polycrystal silicon thin film as the channel layers have electron mobilities so low as about 150 $cm^2/Vs$.

SUMMARY OF THE INVENTION

An object of the present invention is to provide a polycrystal silicon thin film forming method which can provide high electron mobility even when the polycrystal silicon thin film is formed at low temperature, a thin film transistor using the polycrystal silicon thin film, and a liquid crystal display device using the thin film transistor.

The above-described object is achieved by a polycrystal thin film forming method comprising the steps of: forming a semiconductor thin film on a substrate; and flowing a heated gas to the semiconductor thin film while applying an energy beam to the semiconductor thin film to melt the semiconductor thin film at a region the gas is being flowed, and crystallizing the semiconductor thin film in its solidification to form a polycrystal thin film. The energy beam is applied while the high-temperature gas is being flowed, whereby the melted semiconductor thin film can have low solidification rate, whereby the polycrystal thin film can have large crystal grain diameters and can have good quality of little defects in crystal grains and little twins.

BRIEF DESCRIPTION OF THE DRAWINGS

FIGS. 14A and 14B are sectional views of the polycrystal silicon thin film in the steps of the polycrystal silicon thin film forming method according to the third embodiment of the present invention, which show the process (Part 2).

FIGS. 19A and 19B are sectional views of a polycrystal silicon thin film in the steps of the polycrystal silicon thin film forming method according to a sixth embodiment of the present invention, which show the process (Part 1).

DETAILED DESCRIPTION OF THE INVENTION

[A First Embodiment]

Figure 1:
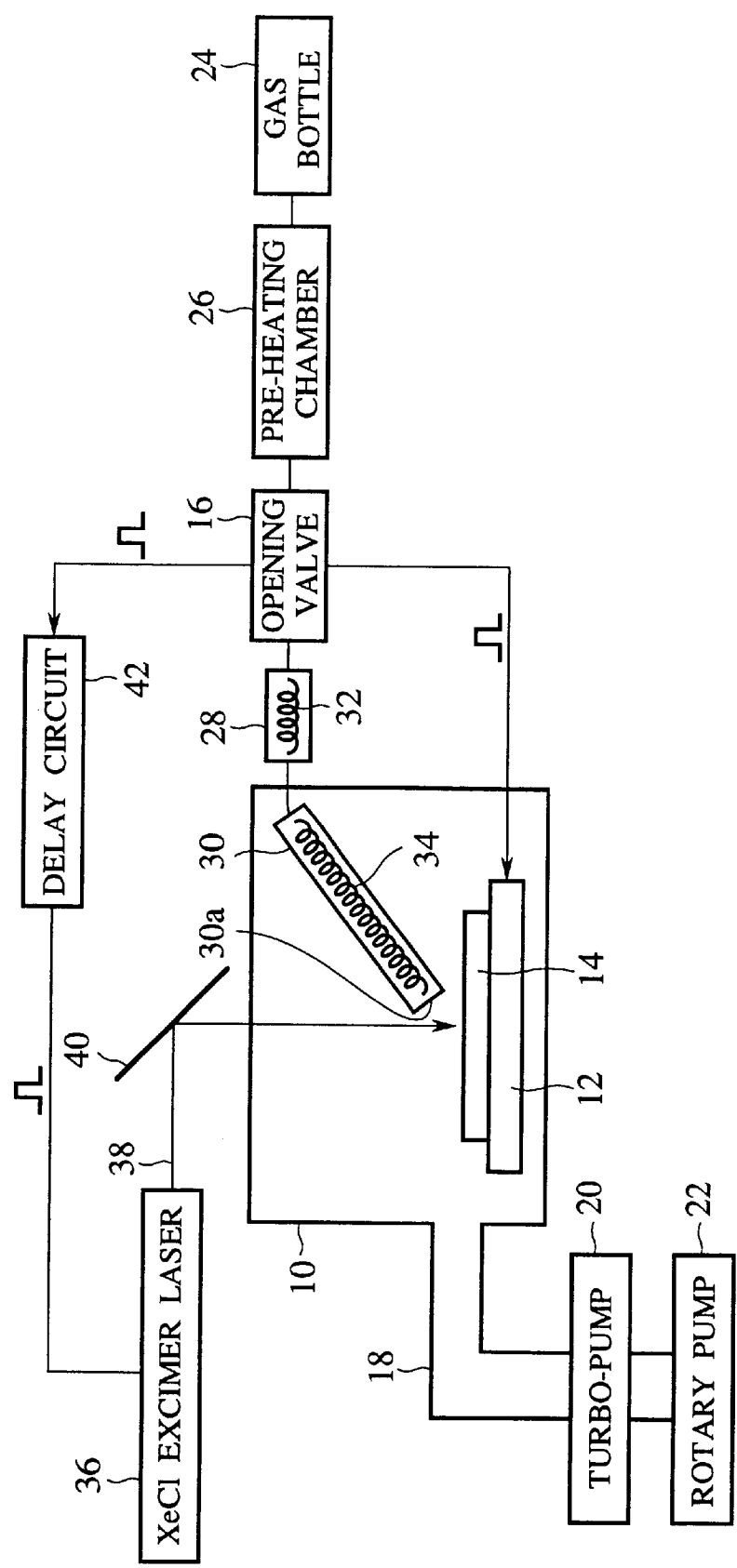
FIG. 1 is a conceptual view of the polycrystal thin film forming system according to a first embodiment of the present invention, which shows a general structure thereof.
Figure 2:
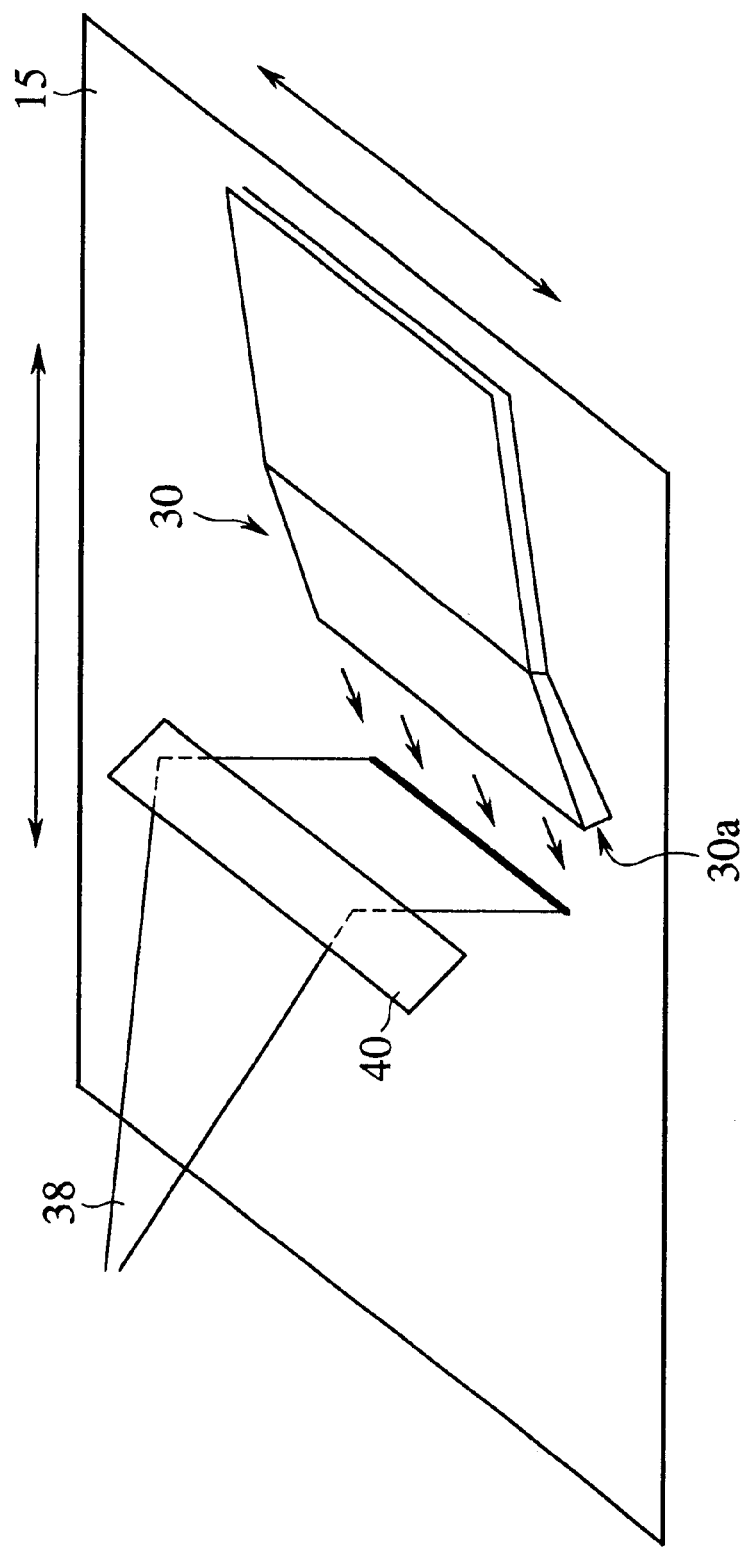
FIG. 2 is a conceptual view of a part of the polycrystal thin film forming system according to the first embodiment of the present invention.
Figure 3A:
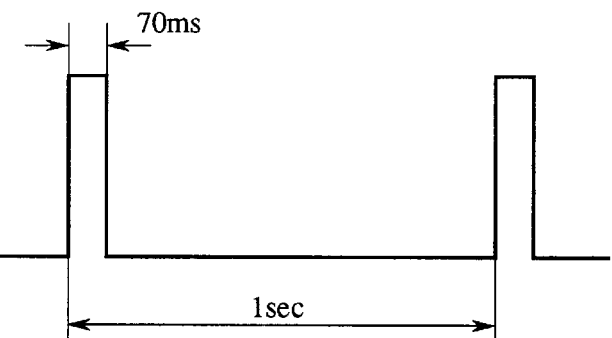
FIGS. 3A to 3C are timing chart of flow of a high-temperature gas, applying a laser beam and temperature changes of the surface of the semiconductor thin film.
Figure 3B:
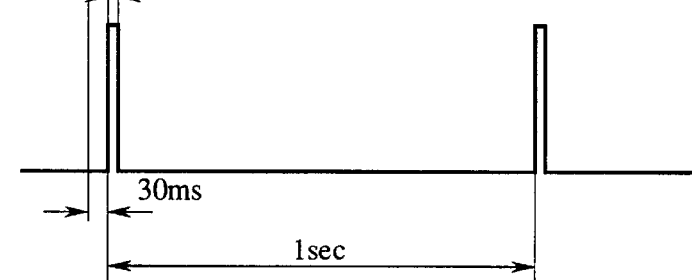
Figure 3C:
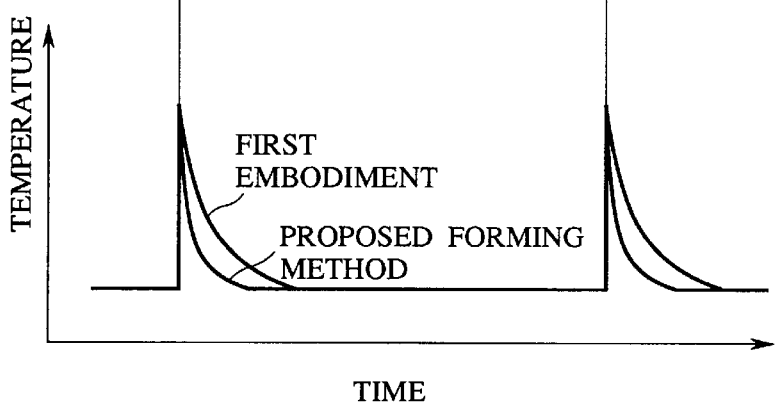

The polycrystal thin film forming method and forming system according to a first embodiment of the present invention will be explained with reference to FIGS. 1 to 3C. FIG. 1 is a conceptual view of a general structure of the polycrystal thin film forming system according to the present embodiment. FIG. 2 is a conceptual view of a part of the polycrystal thin film forming system according to the present embodiment. FIGS. 3A to 3C are timing charts of timing of flowing a high-temperature gas, applying a laser beam, and temperature changes of the surface of the semiconductor thin film.

(Polycrystal Thin Film Forming System)

First, the polycrystal thin film forming system according to the present embodiment will be explained with reference to FIGS. 1 and 2.

As shown in FIG. 1, an X-Y stage 12 is disposed in a chamber 10, and a substrate 14 with a semiconductor thin film 15 (see FIG. 2) formed on the surface is mounted on the X-Y stage 12. A pulse signal is inputted to the X-Y stage 12 by an opening valve 16 in accordance with opening and closing thereof. The X-Y stage 12 is moved by, e.g., 0.05 mm/pulse, based on the pulse signal from the opening valve 16. The X-Y stage 12 includes a heater (not shown) for heating the substrate 14 as required.

An exhaust pump 18 of the chamber 10 is connected to a turbo-pump 20. Air in the chamber 10 is exhausted through the turbo-pump 20 and a rotary pump 22.

An inert gas of high temperature is flowed in pulses, as will be described below, to the semiconductor film 15 formed on the substrate 14.

That is, as shown in FIG. 1, the inert gas in a gas bottle 24 flows into a pre-heating chamber 26 to be heated therein up to a prescribed temperature, e.g., 100° C. The inert gas can be, e.g., argon gas or others. The inert gas which has been heated in the pre-heating chamber 26 up to the prescribed temperature is flowed in pulses through a heating chamber 28 and an flow nozzle 30 to the surface of the semiconductor film 15 as shown in FIG. 2 by the opening valve 16 which is opened periodically in the shape of a pulse.

Heaters 32, 34 are provided respectively in the heating chamber 28 and a flow nozzle 30. The inert gas is heated up to, e.g., 600° C. by the heaters 32, 34. The port 30a of the flow nozzle 30 is large enough to flow the high temperature-inert gas over a larger region than a region on the semiconductor thin film 15 on the substrate 14 for a laser beam to be applied to.

On the other hand, a laser beam 38 is emitted in pulses from an XeCl excimer laser 36 at a timing corresponding to that of flowing the high temperature-inert gas. The laser beam 38 is homogenized by a homogenizer 40 and applied to the semiconductor film 15 on the substrate 14.

That is, a pulse signal is inputted to a delay circuit 42 in accordance with opening and closing of the opening valve 16, and the signal delayed by the delay circuit 42 is inputted to the XeCl excimer laser 36. The XeCl excimer laser 36 emits a laser beam for a prescribed period of time, based on the inputted signal. The laser beam emitted by the XeCl excimer laser 36 is homogenized by the homogenizer 40 as shown in FIG. 2, and applied to the semiconductor thin film 15.

Thus, while the high-temperature inert gas is being flowed in pulses to the surface of the semiconductor thin film 15 formed on the substrate 14, the laser beam 38 is applied in pulses. The substrate 14 is moved by the X-Y stage 12 suitably in the arrowed direction in FIG. 2, whereby a polycrystal thin film is formed on the entire surface.

(Polycrystal Thin Film Forming Method)

Then, the polycrystal thin film forming method according to the present embodiment will be explained by means of an example of forming a polycrystal silicon thin film and with reference to FIGS. 1 to 3C. FIG. 3A shows a timing of flowing the high-temperature gas. FIG. 3B is a timing of applying a laser beam. FIGS. 3A to 3C are time charts of surface temperature changes of the semiconductor thin film.

First, a semiconductor thin film 15 of, e.g, a 70 nm-film thickness silicon thin film is formed on a substrate 14. The substrate 14 can be provided by, e.g., a glass substrate. The silicon thin film can be provided by, eg., an amorphous silicon thin film.

Next, the substrate 14 with the semiconductor thin film 15 formed on is mounted on the X-Y stage 12 in the chamber 10.

Next, air in the chamber 10 is exhausted to reduce a pressure in the chamber 10 to, e.g., $1\times10^{-2}$ Pa.

Then, a laser beam 38 is applied in pulses while a high-temperature inert gas is being flowed in pulses to the semiconductor thin film 15 on the substrate 14. A timing of flowing the high-temperature inert gas is set as exemplified in FIG. 3A. A timing of applying the laser beam is set as exemplified in FIG. 3B.

That is, as shown in FIG. 3A, a pulse width for flowing the high-temperature inert gas is, e.g., 70 ms, and a frequency of the pulse is, e.g., 1 Hz (cycle: 1 second). It is not necessary to pressurize the inert gas. The inert gas can be flowed, without being pressurized, to the semiconductor thin film 15 owing to an atmospheric pressure difference between the chamber 10 and the pre-heating chamber 26, because a pressure inside the chamber 10 is lower than that in the pre-heating chamber 26. The inert gas flows into the chamber 10, and a pressure in the chamber 10 temporarily rises to, e.g., about 100 torr. Under a pressure of such level the inert gas can be flowed to the semiconductor thin film 15 without any trouble.

On the other hand, a timing of beginning to apply the laser beam 38 from the XeCl excimer laser 36 is delayed by, e.g., 30 ms as shown in FIG. 3B, so that the laser beam 38 can be applied to the semiconductor thin film 15 when the semiconductor thin film 15 and its vicinity are kept at a high temperature. A delay time of the delay circuit 42 is 30 ms, whereby the laser beam 38 can be applied at this timing. A period of time, i.e., a pulse width of the laser beam 38 from the XeCl excimer laser 36 is preferably set suitably to melt the semiconductor thin film 15 and can be set at 30 ns as exemplified in FIG. 3B.

It is preferable that the high-temperature inert gas is kept on being flowed to the semiconductor thin film 15 still after the application of the laser beam 38 is finished. Because the high-temperature inert gas is flowed to the semiconductor thin film 15 still after the application of the laser beam 38 is finished, it can take a long period of time as shown in FIG. 3C until the semiconductor thin film 15 is cooled, whereby the semiconductor thin film 15 melted by the laser beam 38 can have a low solidification rate, and accordingly polycrystal thin film of good quality can be formed.

Thus, the laser beam 38 of a 30 ns-pulse width and a 1 Hz-pulse frequency is applied to the semiconductor thin film 15 on the substrate 14, delayed by 30 ms from the start of flowing of the high-temperature inert gas. The laser beam 38 emitted by the XeCl excimer laser 36 is preferably shaped by the homogenizer 40 suitably into, e.g., a 100 mm×1 mm.

A signal outputted by the opening valve 16 is inputted to the X-Y stage 14, and the X-Y stage 14 is moved by 0.05 mm/pulse. Thus, finally polycrystal thin film of good quality can be formed on the substrate 14.

(Crystal Structure)

Figure 4A:
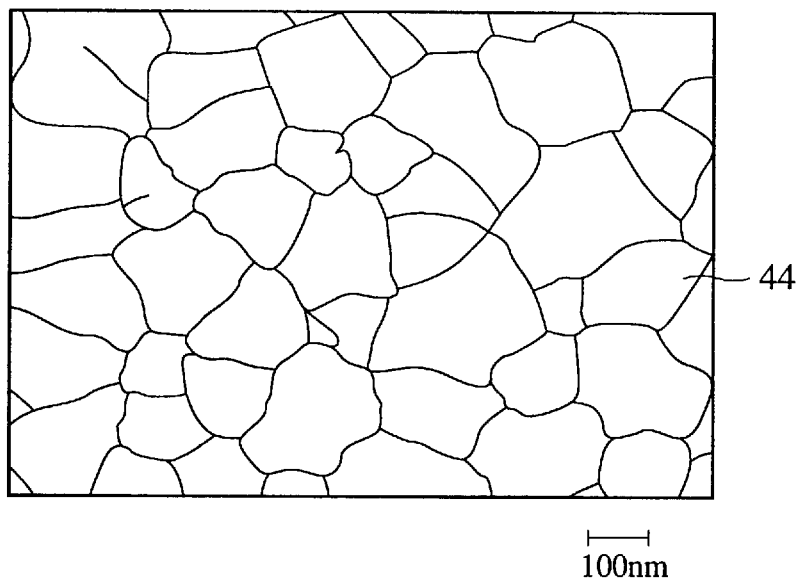
FIGS. 4A and 4B are schematic views of crystal structures of polycrystal silicon thin films.
Figure 4B:
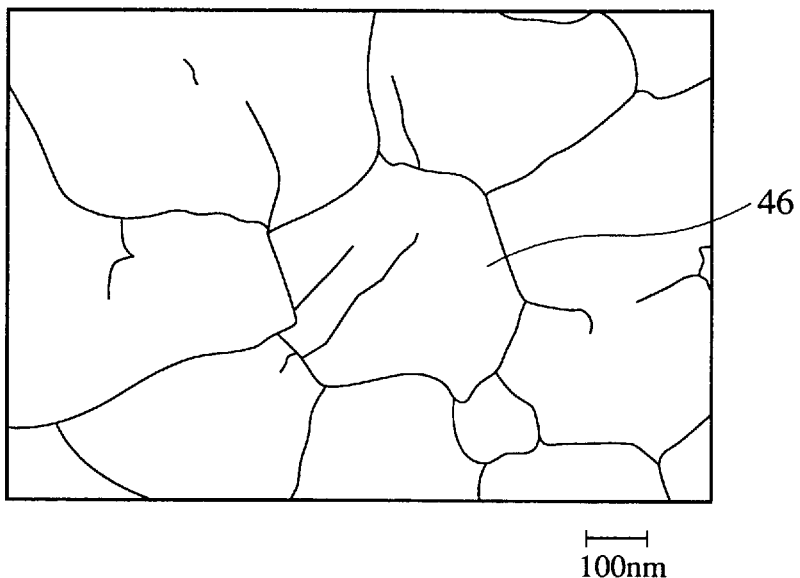

With reference to FIGS. 4A and 4B a crystal structure of a polycrystal thin film formed by the proposed method, i.e., with a laser beam applied without flowing the high-temperature inert gas, and a crystal structure of a polycrystal thin film formed by the method according to the present embodiment, i.e., with a laser beam applied in pulses while the high-temperature inert gas is being flowed will be explained. Here, the polycrystal thin film is exemplified by polycrystal silicon film.

FIG. 4A is a schematic view of a crystal structure of a polycrystal silicon film formed by the proposed method. The polycrystal silicon film was formed and etched with Secco etching, and was observed by a scanning electron microscope. A semiconductor thin film formed in advance on a glass substrate was amorphous silicon thin film, and an applied laser beam had 350 mJ/cm² energy.

On the other hand, FIG. 4B is a schematic view of a crystal structure of a polycrystal silicon thin film formed by the method according to the present embodiment. As in the case shown in FIG. 4A, the polycrystal silicon thin film was formed and Secco-etched, and was observed by a scanning electron microscope. A silicon thin film formed in advance on a glass substrate was amorphous silicon thin film, and the applied laser beam had 300 mJ/cm² energy.

As shown in FIG. 4A, the crystal structure of the polycrystal silicon thin film formed by the proposed method had crystal grains 44 of about 100 nm–about 200 nm grain diameters.

In contrast to this, as shown in FIG. 4B, the crystal structure of the polycrystal silicon thin film formed by the present embodiment had crystal grains of about 300 nm–about 600 nm grain diameters. That is, the method according to the present embodiment can make grain diameters as large as about three times in comparison with the proposed method.

Thus, the present embodiment can form polycrystal thin film having large crystal grain diameters.

(Electric Characteristics)

Figure 5A:
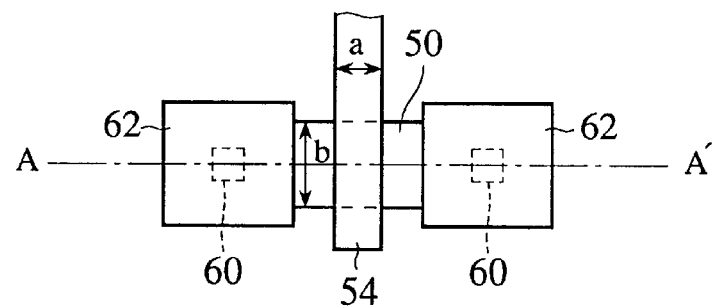
FIGS. 5A and 5B are sectional view and a plan view of a thin film transistor used for evaluation of electric characteristics of the polycrystal thin films.
Figure 5B:
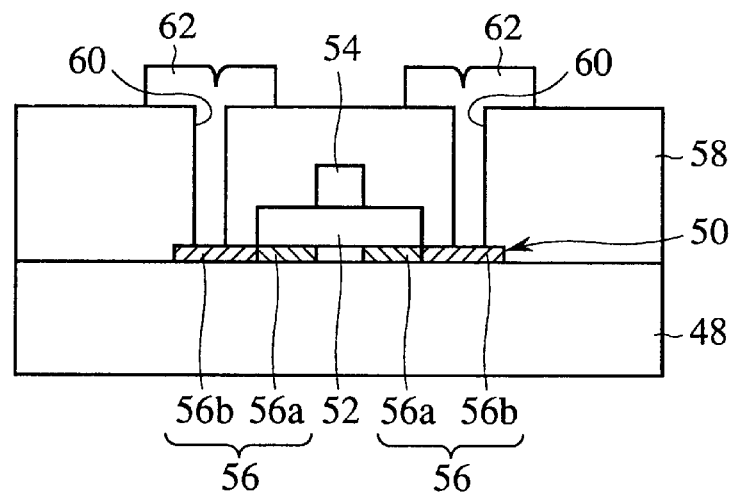
Figure 6A:
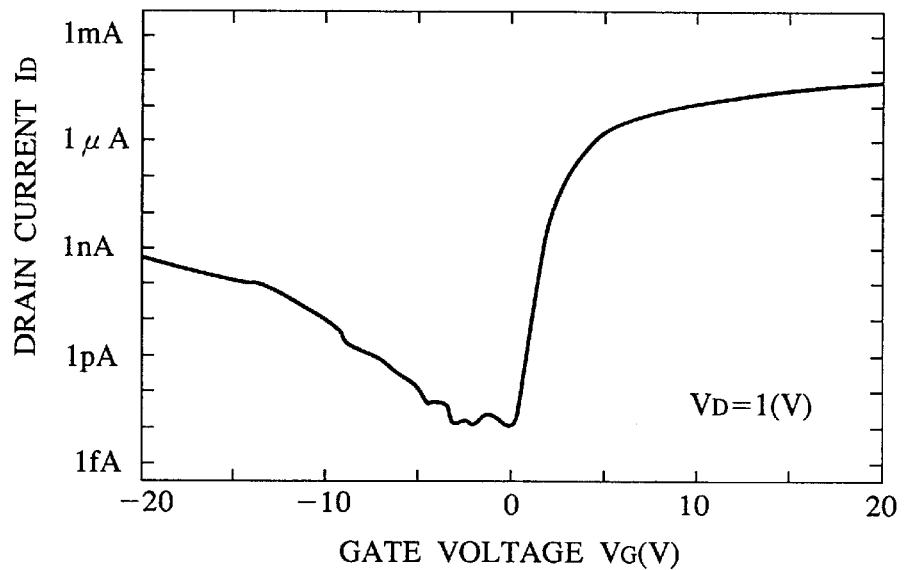
FIGS. 6A and 6B are graphs of $I_D$-$V_G$ characteristics of the thin film transistor.
Figure 6B:
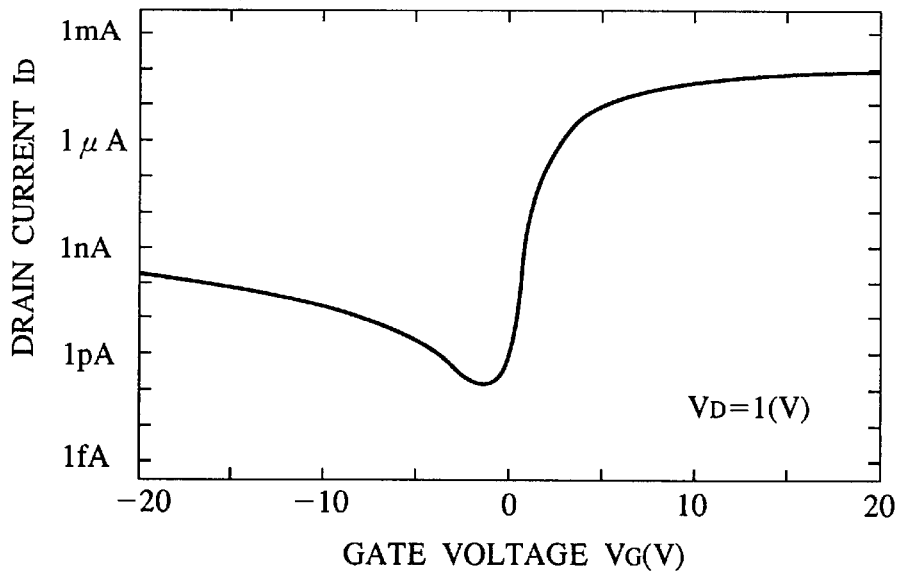
Figure 7A:
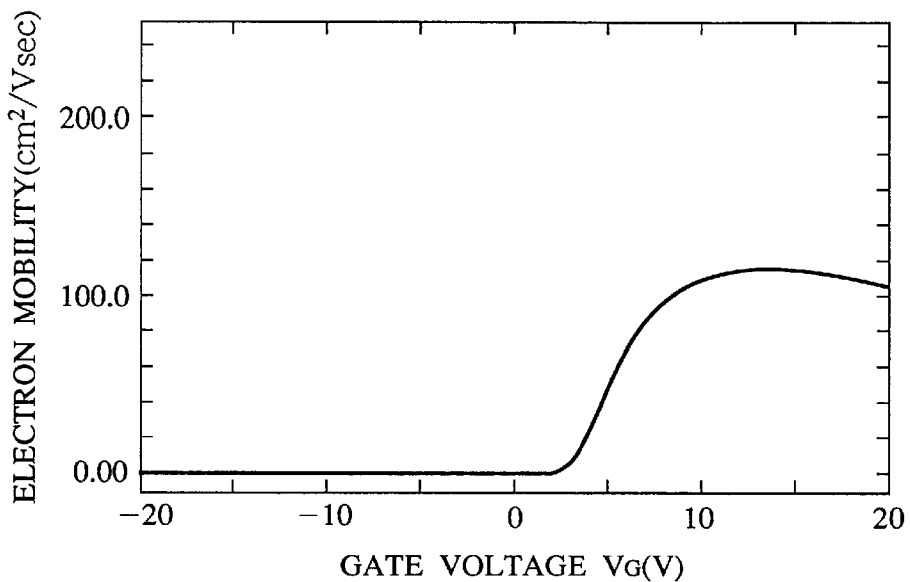
FIGS. 7A and 7B are graphs of electron mobility of the thin film transistor.
Figure 7B:
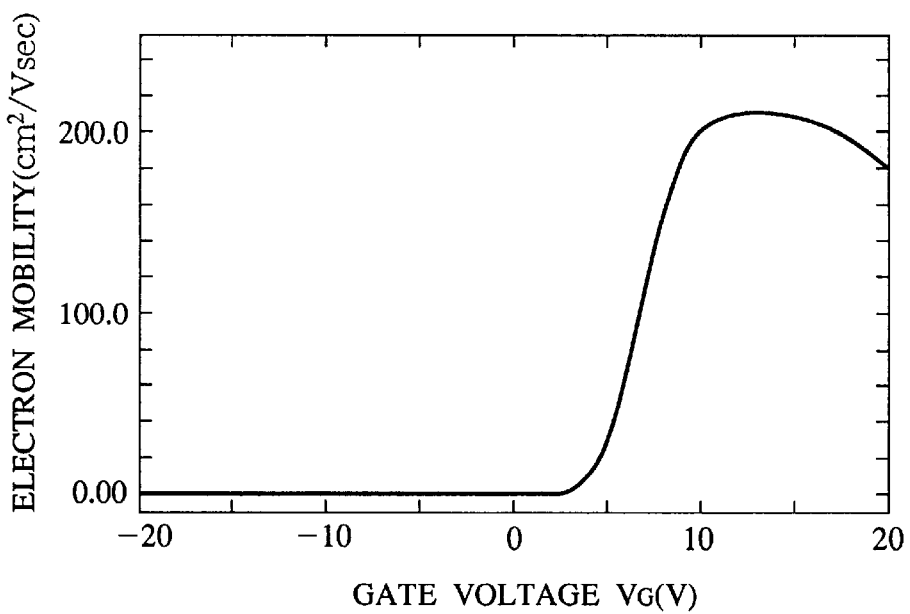

Then, electric characteristics of the polycrystal thin film formed by the present embodiment will be explained by means of an example of a thin film transistor with reference to FIGS. 5A to 7B. FIGS. 5A and 5B are sectional view and a plan view of the thin film transistor used in evaluating electric characteristics of the polycrystal thin film. FIG. 5A is a plan view of the thin film transistor, and FIG. 5B is a sectional view of the thin film transistor along the line A–A' in FIG. 5A. FIGS. 6A and 6B are graphs of $I_D$-$V_G$ ($I_D$: a drain current, $V_G$: a gate voltage) characteristics of the thin film transistor. FIGS. 7A and 7B are graphs of electron mobility characteristics of the thin film transistor.

As shown in FIG. 5B, a polycrystal thin film 50 of a 70 nm-film thickness polycrystal silicon thin film formed as described above is formed on a glass substrate 48. For comparison of electric characteristics of the polycrystal thin film formed by the present embodiment with those of the polycrystal thin film formed by the proposed method, thin film transistors were fabricated by using the respective polycrystal thin films.

A 120 nm-thickness gate insulation film 52 was formed on the polycrystal thin film 50. A gate electrode 54 of an aluminum film was formed on the gate insulation film 52. The gate electrode 54 had a gate length a of 10 μm (see FIG. 5A, and the polycrystal thin film 50 had a width b of 30 μm.

In the polycrystal thin film 50, a lightly-doped diffused layer 56a was formed by self-alignment with the gate electrode 54 and was lightly doped with phosphorus. A heavily doped diffused layer 56b is formed in the polycrystal thin film 50. The lightly doped diffused layer 56a and the heavily doped diffused layer 56b constituted a source/drain diffused layer 56.

Furthermore, an inter-layer insulation film 58 was formed on the entire surface. A contact hole 60 was formed in the inter-layer insulation film 58 from the surface thereof to the heavily doped diffused layer 56b. On the heavily doped diffused layer 56b a source/drain diffused electrode 62 was formed through the contact hole 60.

$I_D$-$V_G$ characteristics of the thin film transistor of such structure will be explained with reference to FIGS. 6A and 6B.

FIG. 6A is a graph of $I_D$-$V_G$ characteristics of the thin film transistor using the polycrystal thin film formed by the proposed method. FIG. 6B is a graph of $I_D$-$V_G$ characteristics of the thin film transistor using the polycrystal thin film formed by the present embodiment. In both FIGS. 6A and 6B, gate voltages $V_G$ are taken on the horizontal axis, and drain currents $I_D$ are taken on the vertical axis. In both FIGS. 6A and 6B the $I_D$-$V_G$ characteristics are for $V_D$=1V ($V_D$: a drain voltage).

As shown in FIG. 6B, the thin film transistor using the polycrystal thin film formed by the present embodiment had better $I_D$–$V_G$ characteristics than the thin film transistor using the polycrystal thin film formed by the proposed method, whose $I_D$–$V_G$ characteristics are shown in FIG. 6A.

Next, electron mobility characteristics of the above-described thin film transistors will be explained with reference to FIGS. 7A and 7B.

FIG. 7A is a graph of electron mobility characteristics of the thin film transistor using the polycrystal silicon thin film formed by the proposed method. On the other hand, FIG. 7B is a graph of electron mobility characteristics of the thin film transistor using the polycrystal thin film formed by the present embodiment. In both FIGS. 7A and 7B, gate voltages $V_G$ are taken on the horizontal axis, and electron mobilities are taken on the vertical axis. Both in FIGS. 7A and 7B, the electron mobilities are for $V_D$=1V ($V_D$: a drain voltage), i.e., electron mobilities in a linear region of the thin film transistor.

A maximum electron mobility value of the thin film transistor using the polycrystal thin film formed by the proposed method was 100 cm$^2$/Vsec as shown in FIG. 7A, while a maximum electron mobility value of the thin film transistor using the polycrystal thin film formed by the present embodiment was 200 cm$^2$/Vsec. Thus, the thin film transistor using the polycrystal thin film formed by the present embodiment had electron mobility which was twice that of the thin film transistor using the polycrystal thin film formed by the proposed method.

As described above, according to the present embodiment, a laser beam is applied in pulses while the high-temperature inert gas is flowed in pulses, whereby the melted semiconductor thin film can have a low solidification rate. Resultantly the polycrystal thin film having large grain diameters and having little defects in the crystal particles and little twins. Because the high-temperature inert gas is flowed in pulses, it never occurs that a temperature of the substrate is increased, deforming the substrate. Even in a case that the polycrystal thin film is formed on a substrate having a low heat-resistance temperature, the polycrystal thin film can have good quality. Even in a case that the polycrystal thin film is formed at a low temperature, the polycrystal thin film can have large crystal grains, and the polycrystal thin film can have high electron mobility.

[A Second Embodiment]

The polycrystal silicon thin film forming method according to a first embodiment of the present invention will be explained with reference to FIGS. 8A to 12D. FIGS. 8A to 10B are sectional views of the polycrystal silicon thin film in the step of the polycrystal silicon thin film forming method according to the present embodiment. FIG. 11 is a graph of temperature changes of respective parts after laser beam application. FIGS. 12A to 12D are conceptual views of the polycrystal silicon thin film, which show crystal states.

A buffer layer 112 of a 200 nm-thickness silicon oxide film is formed on a glass substrate 110 by PECVD (Plasma-Enhanced Chemical Vapor Deposition).

Next, a silicon layer 114 of a 50 nm-thickness amorphous silicon layer is formed on the buffer layer 112 by PECVD.

Figure 8A:
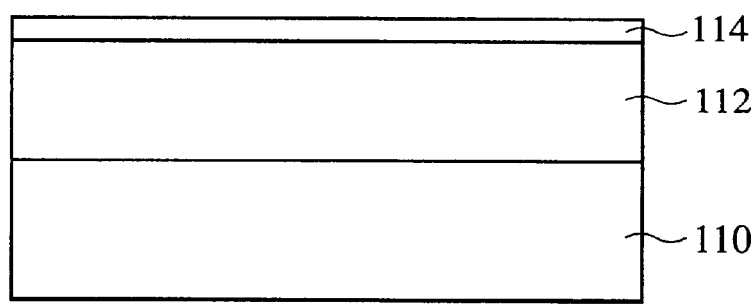
FIGS. 8A to 8C are sectional views of a polycrystal silicon thin film in the steps of the polycrystal silicon thin film forming method according to a second embodiment of the present invention, which show the process (Part 1).

Then, a heat treatment is performed at 450° C. for 2 hours to thereby remove hydrogen from the silicon layer 114 (see FIG. 8A).

Figure 8B:
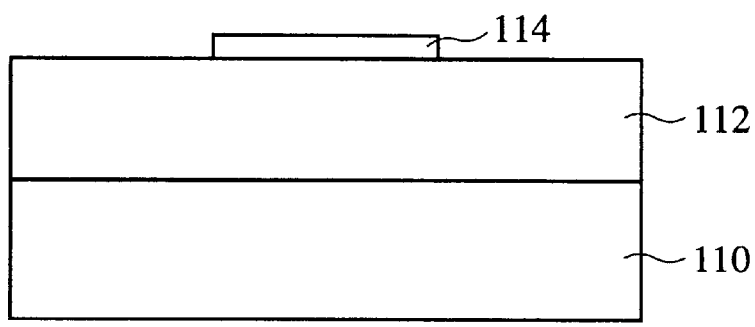

Next, the silicon layer 114 is patterned by photolithography into a 8 µm×8 µm shape (see FIG. 8B).

Figure 8C:
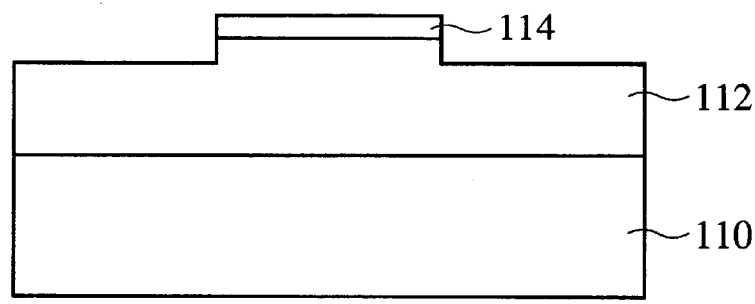

Then, the surface of the buffer 112 is etched with an HF-based etchant and with the silicon layer 114 as a mask to thereby form a step in the buffer layer 112 (see FIG. 8C).

Figure 9A:
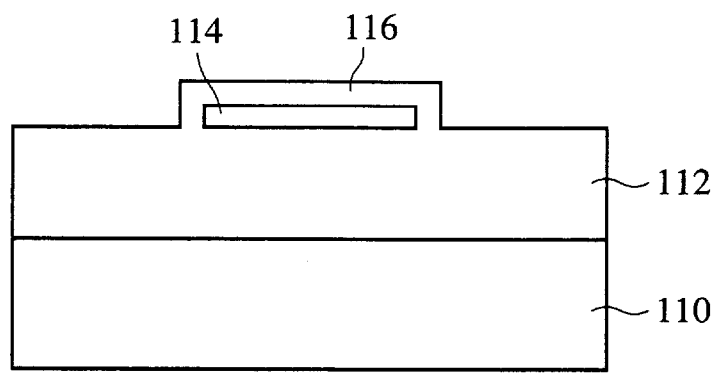
FIGS. 9A and 9B are sectional views of the polycrystal silicon thin film in the steps of the polycrystal silicon thin film forming method according to the second embodiment of the present invention, which show the process (Part 2).

Then, an isolation film 116 of a 30 nm-thickness silicon oxide film is formed on the entire surface by PECVD (see FIG. 9A). The isolation film 116 is preferably formed of a material having a higher melting point than the silicon layer 114. This is because if the isolation film 116 is melted when the silicon layer 114 is crystallized, the silicon layer 114 and a heat reservoir layer 118 (see FIG. 9B) are integrated with each other. The isolation film 116 preferably functions as an etching stopper when the heat reservoir layer 118 is etched.

Figure 9B:
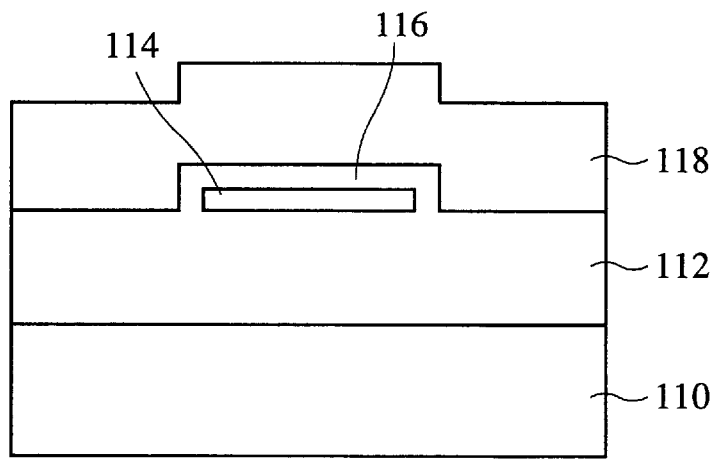

Then the heat reservoir film 118 is formed of an 300 nm-thickness polycrystal silicon film on the entire surface by PECVD (see FIG. 9B). The film forming conditions can be, e.g., a low rate ratio of 2:98 between $SiH_4$ gas and $H_2$ gas and a temperature of 550° C. inside the film deposition chamber.

Figure 10A:
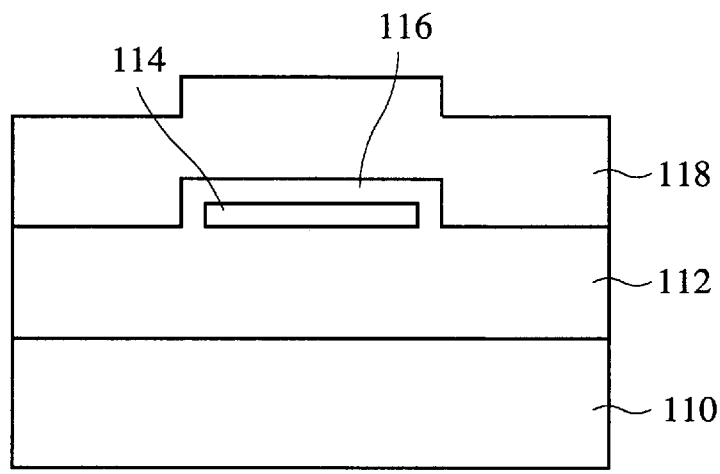
FIGS. 10A and 10B are sectional views of the polycrystal silicon thin film in the steps of the polycrystal silicon thin film forming method according to the second embodiment of the present invention, which show the process (Part 3).
Figure 11:
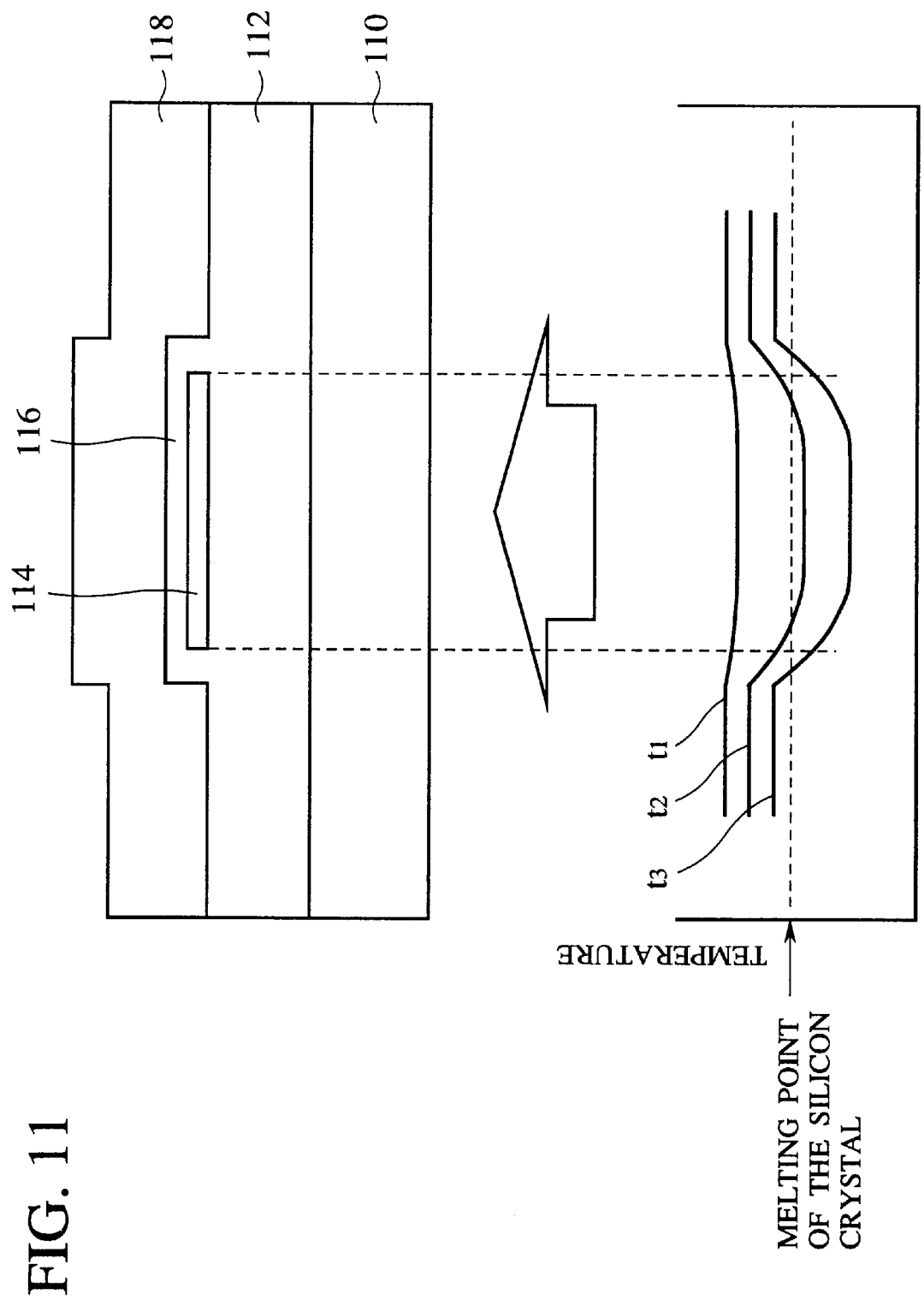
FIG. 11 is a graph of temperatures changes of respective parts after the laser beam application.

Next, short pulsed laser beams are applied to the silicon layer 114 at the room temperature on the side of the underside of the glass substrate 110, i.e., where the buffer layer 112 is not formed, to crystallize the silicon layer 114 (FIG. 10A). Short pulsed laser beams mean laser beams of a pulse of a short period of time. For the short pulsed laser beams, an excimer laser, for example, can be used. A pulse width can be, e.g., 30 ns, and a pulse number can be 20 times/second. An irradiation method for the short pulsed laser beams can be, e.g., overlapping scan irradiation method.

As shown in FIG. 10A, in the present embodiment the silicon layer 114 is covered by the heat reservoir film 118. Because of the heat reservoir layer 118 covering the silicon layer 114 a cooling speed of the silicon layer 114 is low after laser pulses have been applied to the silicon layer 114.

Temperatures of respective parts after the laser beam application will be explained with reference to FIG. 11. In FIG. 11, $t_1$, $t_2$ and $t_3$ represent times after the laser beam application is finished. In FIG. 11, $t_1$ indicates temperatures of the respective parts after a period of time $t_1$ from the finish of the pulsed laser beam application, $t_2$ indicates temperatures of the respective parts after a period of time $t_2$ from the finish of the pulsed laser beam application, and $t_3$ indicates temperatures of the respective parts after a period of time $t_3$ from the finish of pulsed laser beam application. A period of time $t_1$ occurs before a time $t_2$, and the time $t_2$ occurs before a time $t_3$.

The silicon layer 114 is covered by the heat reservoir layer 118, and vicinities of the ends of the silicon layer 114 have a lower cooling speed. In comparing temperatures of the respective parts after a period of time $t_2$ from the finish of the laser beam application, the central part of the silicon layer 114 has a temperature which has lowered below the melting point of the silicon crystal, but the vicinities of the ends of the silicon layer 114 retain a temperature higher than the melting point of the silicon crystal. Thus, the silicon layer 114, which is covered by the heat reservoir layer 118, has a lower cooling speed in the vicinities of the ends of the silicon layer 114. In other words, because it takes a longer time for the vicinities of the ends of the silicon layer 114 to have a temperature lower than the melting point of the silicon crystal, nuclei are generated inside the silicon layer 114, and crystals grow laterally, with a result that large crystal grains can be formed.

The silicon layer 114 is thus crystallized, and a polycrystal silicon thin film 114a is generated.

Then, the heat reservoir layer 118 is etched by RIE (Reactive Ion Etching) with the isolation film 116 as an etching stopper.

Figure 10B:
Figure 10B:
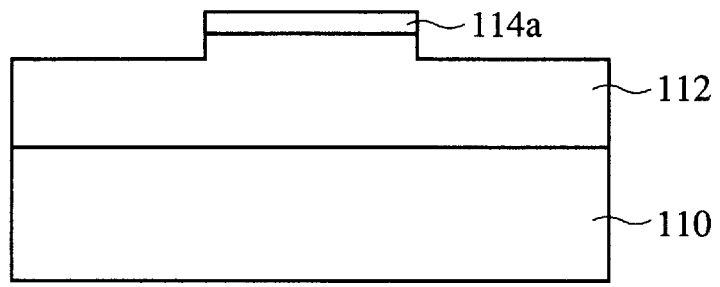

Next, the isolation film 116 is etched by an HF-based wet etching (see FIG. 10B).

Thus, the polycrystal silicon thin film 114a is formed by the present embodiment.

(Evaluation Result)

Figure 12A:
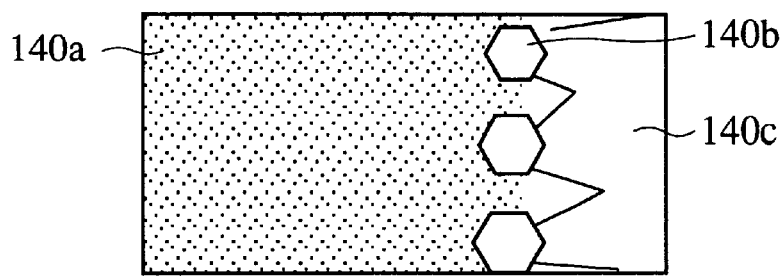
FIGS. 12A to 12D are conceptual views of crystal states of the polycrystal silicon thin film.

Next, crystal states of the thus-formed polycrystal silicon thin film will be explained with reference to FIG. 12A. FIG. 12A is a conceptual view of a crystal states of the polycrystal silicon film formed by the present embodiment. FIG. 12A enlarges the vicinities of the ends of thee silicon layer. Crystal states of the polycrystal silicon film can be observed by, e.g., TEM (Transmission Electron Microscopy).

The side of the polycrystal silicon thin film 114a nearer to the center thereof is shown on the left side of the drawing of FIG. 12A. The side of the polycrystal silicon thin film 114a nearer to the end thereof is shown on the right side of the drawing of FIG. 12A. On the left side of the drawing, i.e., the side of the polycrystal silicon thin film 114a nearer the central part thereof, the polycrystal silicon thin film 114a has small crystal grain diameters and has a tiny grain diameter-polycrystal silicon region 140a. On the right side of the drawing, i.e., in a region spaced by a certain distance from the end of the polycrystal silicon thin film 114a, a large-diameter silicon crystals 140b are formed. On the side of the drawing, i.e., in the vicinity of the end of the polycrystal silicon thin film 114a, large-grain diameter silicon crystals 140c which have laterally grown are formed. The nuclei are formed by the large-grain diameter silicon crystals 140b and laterally grow to be the silicon crystals 140c.

As described above, according to the present embodiment, because the silicon layer is covered by the heat reservoir layer, the silicon layer subjected to the laser beam application can have lower cooling speed, whereby polycrystal silicon thin film having large grain diameters can be formed.

[A Third Embodiment]

The polycrystal silicon thin film forming method according to a third embodiment of the present invention will be explained with reference to FIGS. 13A to 15. FIGS. 13A to 15 are sectional views of a polycrystal silicon thin film in the steps of the polycrystal silicon thin film forming method according to the present embodiment, which show the process. The same members of the present embodiment are represented by the same reference numbers as those of the polycrystal silicon thin film forming method according to the second embodiment shown in FIGS. 8A to 12D not to repeat or to simplify their explanation.

The steps of the polycrystal silicon thin film forming method according to the second embodiment up to the step of forming a step in a buffer layer 112 are the same as those of the polycrystal silicon thin film forming method according to the second embodiment as shown in FIGS. 8A to 8C. The steps are not explained here.

Figure 13A:
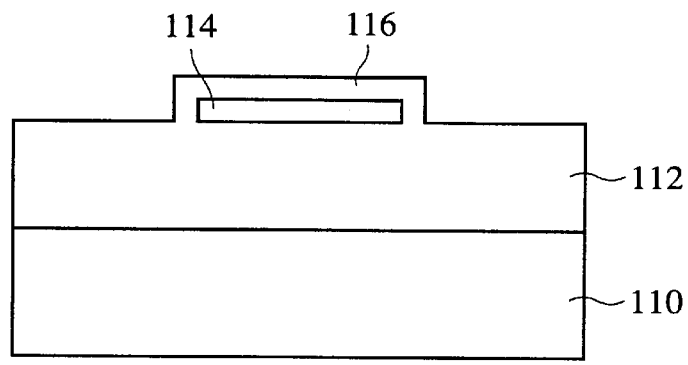
FIGS. 13A and 13B are sectional views of a polycrystal silicon thin film in the steps of the polycrystal silicon thin film forming method according to a third embodiment of the present invention, which show the process (Part 1).

Then, an isolation film 116 of a 30 nm-thickness silicon oxide film is formed on the entire surface by PECVD (see FIG. 13A).

Next, a heat reservoir film 118 of a 300 nm-thickness amorphous silicon film is formed on the entire surface by PECVD.

Figure 13B:
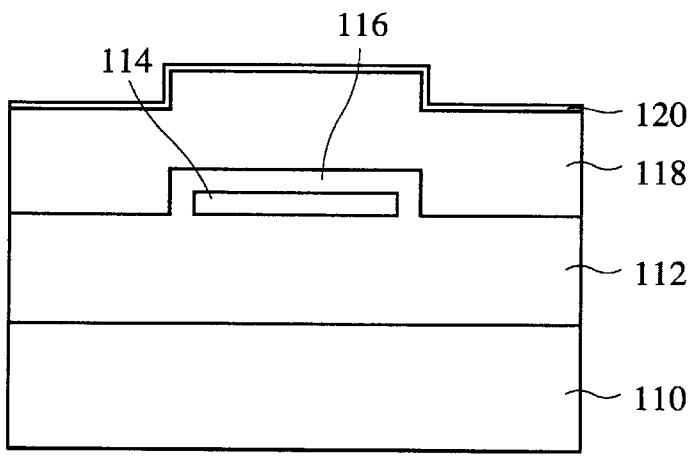

Subsequently, a doped layer 120 of an 3 nm-thickness Ni film is formed on the entire surface by sputtering (see FIG. 13B).

Next, a heat treatment is performed at 550° C. for 8 hours to solid-phase diffuse the Ni in the doped layer 120 in the heat reservoir layer 118, so that the solid-phase growth of amorphous silicon using Ni forms a heat reservoir film 118a of a polycrystal silicon layer (see FIG. 14A).

Next, short pulsed laser beams are applied to the silicon layer 114 on the side of the underside of a glass substrate 110 to crystallize the silicon layer 114 (see FIG. 14B). For the short pulsed laser beams, an excimer laser, for example, can be used as in the second embodiment. The same pulse width, pulse number, etc. as in the second embodiment can be used.

Because of the silicon layer 114 covered by the heat reservoir film 118a, the silicon layer 114 after subjected to the laser beam application has lower cooling speed. Vicinities of the ends of the silicon layer take a longer period of time to lower a temperature below the melting point of the silicon crystal, whereby nuclei are formed inside the silicon layer, and crystals laterally grow. Thus lateral crystal growth can be realized. Crystals thus laterally grow, with a result that large crystal grains can be formed.

Thus, the silicon layer 114 is crystallized, and the polycrystal silicon thin film 114b is formed.

Next, the heat reservoir film 118a is etched by RIE with the isolation film 116 as an etching stopper.

Figure 15:
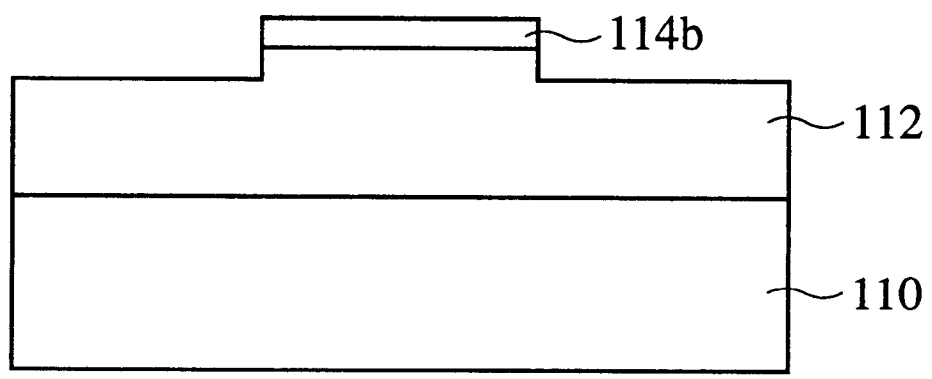
FIGS. 15 is sectional view of the polycrystal silicon thin film in the steps of the polycrystal silicon thin film forming method according to the third embodiment of the present invention, which show the process (Part 3).

Then, the isolation film 116 is etched by HF-based wet etching (see FIG. 15).

Thus, a polycrystal silicon thin film is formed by the present embodiment.

(Evaluation Result)

Next, crystal states of the polycrystal silicon thin film formed as described above will be explained.

A polycrystal silicon thin film 114b formed by the present embodiment has the same crystal state as shown in FIG. 12A.

As described above, according to the present embodiment, because the silicon layer is covered by the heat reservoir film, the vicinities of the ends of the silicon layer after subjected to the laser beam application can have lower cooling speed. Due to lower cooling speed in the vicinities of the ends of the silicon layer nuclei are formed inside the silicon layer, and crystals laterally grow. A polycrystal silicon thin film having large grain diameters can be formed.

Crystal states of the silicon layer as subjected to the short pulse laser beam application on the side of the upper surface of the glass substrate 110, i.e., the upper surface of the heat reservoir layer 118a was evaluated as a control.

As a result of the evaluation it was found that the silicon layer had small crystal grain diameters and was polycrystal silicon of micro-grain diameters. This is considered to be because excimer laser beams required for the crystallization of the silicon layer 114 are absorbed by the heat reservoir layer 118a, and sufficient heat required for the crystallization of the silicon layer 114 is not conducted to the silicon layer 114.

[A Fourth Embodiment]

Figure 16A:
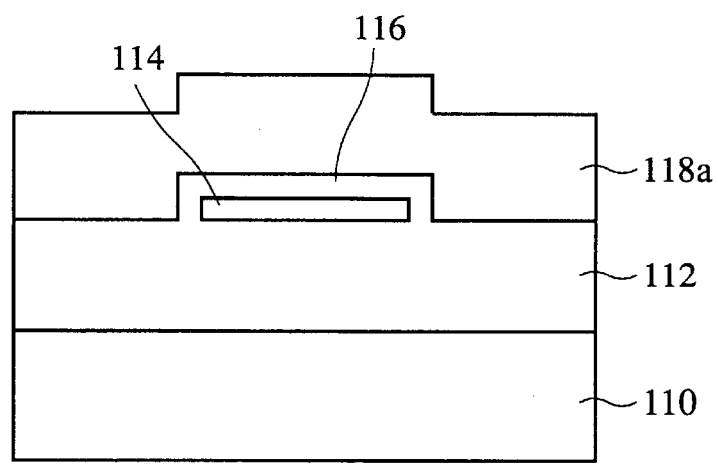
FIGS. 16A and 16B are sectional views of a polycrystal silicon thin film in the steps of the polycrystal silicon thin film forming method according to a fourth embodiment of the present invention.
Figure 16B:
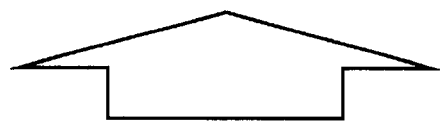
Figure 16B:
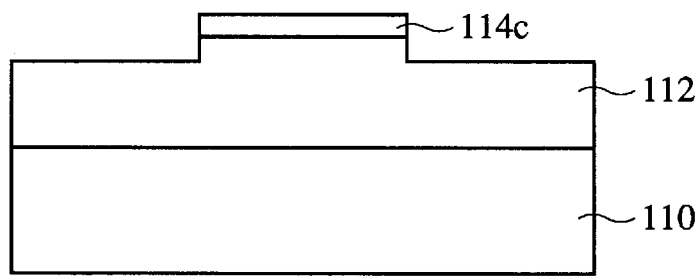
Figure 17:
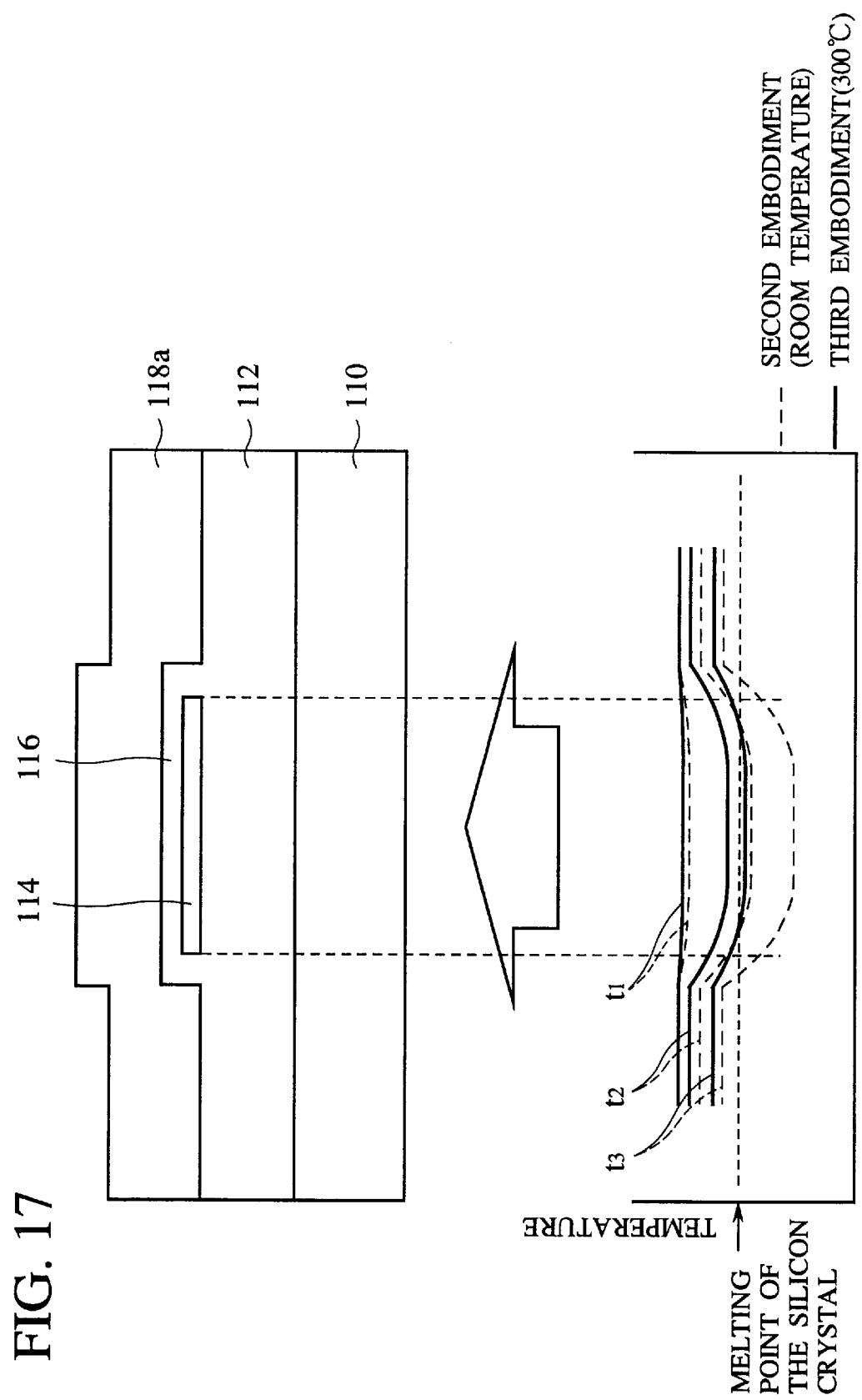
FIG. 17 is a graph of temperatures changes of respective parts after the laser beam application.

The polycrystal silicon thin film forming method according to a fourth embodiment of the present invention will be explained with reference to FIGS. 16A to 17. FIGS. 16A and 16B are sectional views of the polycrystal silicon thin film in the step of the polycrystal silicon thin film forming method according to the present embodiment, which show the process. FIG. 17 is a graph of temperature changes of respective parts after laser beam application. The same members of the present embodiment as those of the polycrystal silicon thin film forming method according to the second or the third embodiment shown in FIGS. 8A to 15 are represented by the same reference numbers not to repeat or to simplify their explanation.

The polycrystal silicon thin film forming method according to the present embodiment is the same as that according to the third embodiment up to the steps of forming the heat reservoir film 118a, and the steps are not explained here.

Then, a glass substrate 110 is heated to 300° C., and short pulsed laser beams are applied to a silicon layer 114 on the side of the underside of the glass substrate 110 to crystallize the silicon layer 114 (see FIG. 16A). Deformation of the glass takes place at a temperature above about 600° C.–700° C., and the glass substrate 110, which has been heated to 300° C., is never deformed.

Temperatures of respective parts after the laser beam application will be explained with reference to FIG. 17. In the graph shown FIG. 17, the broken lines indicate temperatures of the respective parts in the case that glass substrate 110 is set at the room temperature, i.e., in the case of the third embodiment, and the solid lines indicate temperatures of the respective parts in the case that the glass substrate 110 is set at 300° C., i.e., in the case of the present embodiment.

In the present embodiment, the glass substrate 110 is heated to 300° C., and the respective parts of the silicon layer 114 have low cooling speeds. In comparing temperatures of the respective parts of the silicon layer 114 after a period of time $t_2$, in the second embodiment the central part of the silicon layer 114 has a temperature which is lower than the melting point of the silicon crystal, but in the present embodiment the entire silicon layer 114 retains a temperatures higher than the melting point of the silicon crystal. As described above, in the present embodiment the glass substrate 110 is heated to 300° C., and the silicon layer 114 has a low cooling speed. In other words, in the present embodiment the silicon layer 114 takes a longer period of time than in the second and the third embodiment to have a temperature below the melting point of the silicon crystal, and crystals laterally grow in a wide range. Silicon crystals of large grain diameters can be formed.

The silicon layer 114 is thus crystallized, and a polycrystal silicon thin film 114c is formed.

Then, the heat reservoir layer 118a is etched by RIE with the isolation film 116 as an etching stopper.

Next, the isolation film 116 is etched by HF-based wet etching (see FIG. 16B).

Thus a polycrystal silicon thin film is formed by the present embodiment.

(Evaluation Result)

Figure 12B:
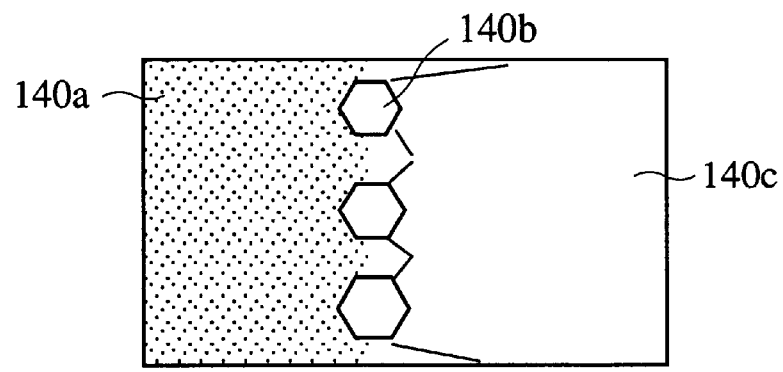

Then, crystal states of the thus-formed polycrystal silicon thin film will be explained with reference to FIG. 12B. FIG. 12B is conceptual views of crystal states of the polycrystal silicon thin film formed by the present embodiment.

As shown in FIG. 12B, in the present embodiment a region where the silicon polycrystals 140c which have laterally grown and have large grain diameters is wider than in the second and the third embodiments shown in FIG. 12A.

As described above, according to the present embodiment the glass substrate is heated to 300° C. and is subjected to the laser beam application, whereby the silicon layer after subjected to the short pulsed laser beam application can have lower cooling speed. As a result, nuclei are formed inside the silicon layer, and crystals laterally grown toward the ends of the silicon layer in a wide range. A polycrystal silicon thin film of polycrystal silicon having large grain diameters can be formed.

[A Fifth Embodiment]

Figure 18A:
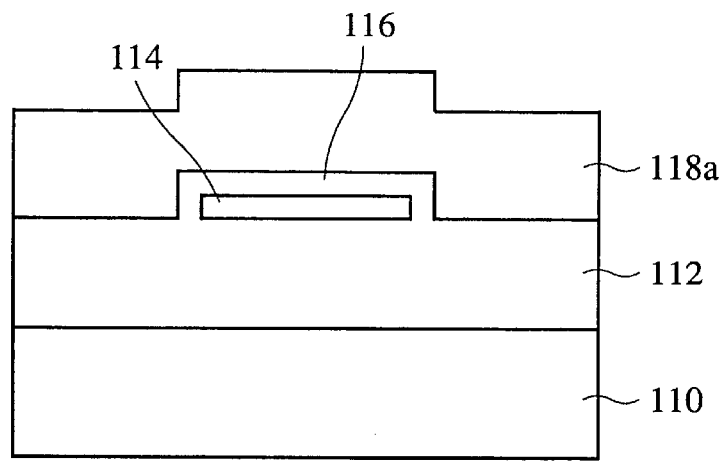
FIGS. 18A and 18B are sectional views of a polycrystal silicon thin film in the steps of the polycrystal silicon thin film forming method according to a fifth embodiment of the present invention.
Figure 18B:
Figure 18B:
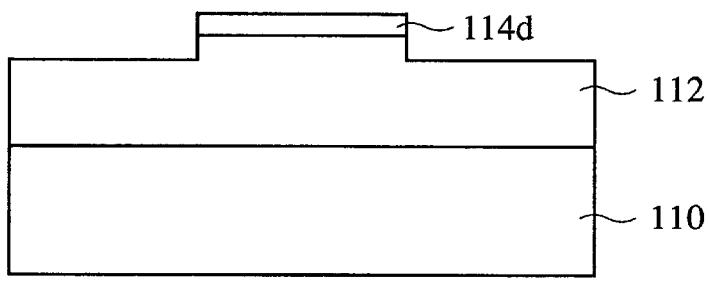

The polycrystal silicon thin film forming method according to a fifth embodiment of the present invention will be explained with reference to FIGS. 18A and 18B. FIGS. 18A and 18B are sectional views of a polycrystal silicon thin film in the steps of the polycrystal silicon thin film forming method according to the present embodiment, which show the process. The same members of the present embodiment as those of the polycrystal silicon thin film forming method according to the second to the fourth embodiments shown in FIGS. 8A to 17 are represented by the same reference numbers not to repeat or to simplify their explanation.

The polycrystal silicon thin film forming method according to the present embodiment is characterized in that a 700 nm-thickness buffer layer 112 is formed on a glass substrate 110, a 100 nm-thickness silicon layer 114 is formed on the buffer layer 112, and short pulsed laser beams are applied with the glass substrate 110 set at a temperature as high as 500° C.

First, the buffer layer 112 of a 700 nm-thickness silicon oxide film is formed on the glass substrate 110 by PECVD. The buffer layer 112 is formed thicker to be 700 nm than in the second to the fourth embodiments, and this is because the silicon layer 114 after subjected to the laser beam application has low cooling speed.

Then, the silicon layer 114 of a 100 nm-thickness amorphous silicon layer on the buffer layer 112 by PECVD. The silicon layer 114 is formed thicker to be 100 nm than in the second to the fourth embodiments, and this is because the silicon layer 114 has a large heat capacity to have low cooling speed.

The following steps of the present embodiment up to the step of forming a heat reservoir film 118a are the same as those of the third embodiment, and their explanation is omitted.

Next, the glass substrate 110 is set at 500° C., and short pulsed laser beams are applied on the side of the underside of the glass substrate 110 to crystallize the silicon layer 114 (see FIG. 18A). Deformation of glass takes place at a temperature above about 600° C.–700° C., and the glass substrate 110 is never deformed when the glass substrate 110 is heated to 500° C. The glass substrate 110, which is heated to 500° C. and is as thick as 100 nm, has low cooling speed. In other words, in the present embodiment the silicon layer 114 can take a longer period of time than in the second to the fourth embodiments to have a temperature lower than the melting point of the silicon crystal. Lateral growth can be realized in a wider range, and silicon crystals having large grain diameters can be formed.

Thus the silicon layer 114 is crystallized, and a polycrystal silicon thin film 114d is formed.

Then, the heat reservoir layer 118a is etched by RIE with the isolation film 116 as an etching stopper.

Next, the isolation film 116 is etched with an HF-based etchant (see FIG. 18B).

Thus a polycrystal silicon thin film is formed by the present embodiment.

(Evaluation Result)

Figure 12C:
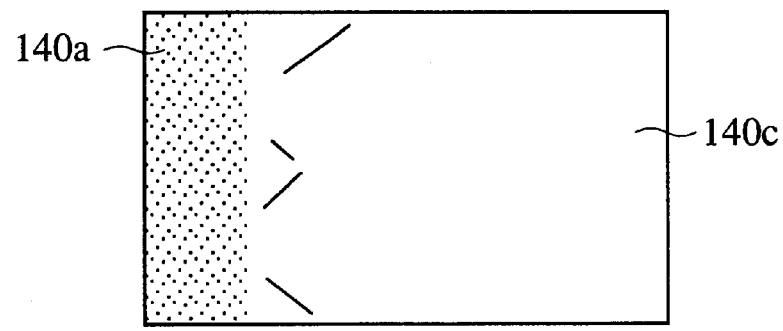

Then, crystal states of the polycrystal silicon thin film formed as described above will be explained with reference to FIG. 12C. FIG. 12C is conceptual views of crystal states of the polycrystal silicon thin film formed by the present embodiment.

As shown in FIG. 12C, in the present embodiment a region where silicon polycrystals 140c laterally grown and having large grain diameters is larger than in the second to the fourth embodiment shown in FIGS. 12A and 12B. None of the silicon polycrystals 140b of large grain diameters observed in FIGS. 12A and 12B are observed in the present embodiment.

As described above, according to the present embodiment, the silicon layer is formed thick, and the laser beams are applied with the glass substrate heated to 500° C., whereby the silicon layer after subjected to the short pulsed laser beam application can have lower cooling speed than in the third embodiment. As a result, nuclei are formed inside the silicon layer, and crystal laterally grow toward the ends of the silicon layer in a wide range. A polycrystal silicon thin film of polycrystal silicon of large grain diameters can be formed.

[A Sixth Embodiment]

Figure 20:
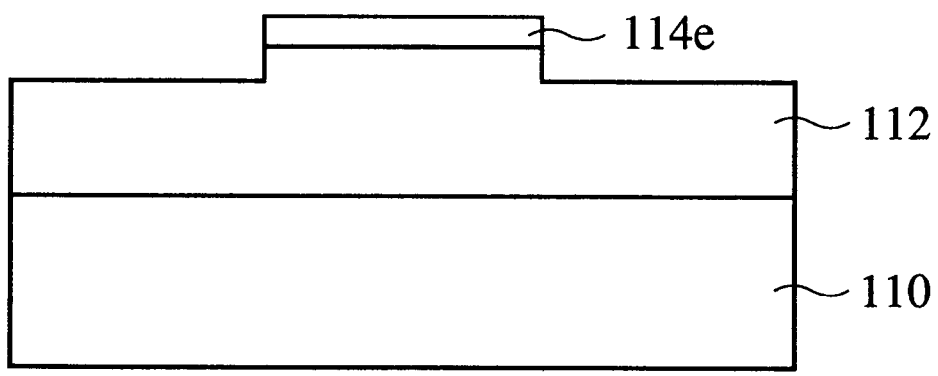
FIG. 20 is sectional view of the polycrystal silicon thin film in the steps of the polycrystal silicon thin film forming method according to the sixth embodiment of the present invention, which show the process (Part 2).

The polycrystal silicon tin film forming method according to a sixth embodiment of the present invention will be explained with reference to FIGS. 19A to 20. FIGS. 19A to 20 are sectional views of a polycrystal silicon thin film in the steps of the polycrystal silicon thin film forming method according to the present embodiment, which show the process. The same members of the present embodiment as those of the second to the fifth embodiments shown in FIGS. 8A to 18B are represented by the same reference numbers not to repeat or to simplify their explanation.

The polycrystal silicon thin film forming method according to the present embodiment is characterized mainly in that an opening 122 is formed in a heat reservoir layer 118a to thereby set cooling speeds of respective parts of a silicon layer 114 at suitable temperatures.

The steps of the present embodiment up to the step of forming the heat reservoir layer 118a are the same as those of the polycrystal silicon thin film forming method according to the fifth embodiment, and their explanation is omitted.

Next, an opening 122 is formed in the heat reservoir layer 118a from the surface thereof down to a depth of 200 nm (see FIG. 19A). A diameter of the opening 122 can be, e.g., 1 μm. A configuration and a depth of the opening 122 can be suitably set so that the respective parts of the silicon layer 114 can be cooled at required cooling speeds.

Next, a glass substrate 110 is heated to 500° C., and short pulsed laser beams are applied on the side of the underside of the glass substrate 110 to crystallize the silicon layer 114 (see FIG. 19B). Because of the opening 122 formed in the heat reservoir layer 118a on the silicon layer 114, the heat reservoir layer 118a has the heat reservoir function lowered, and the silicon layer 114 near the opening 122 has higher cooling speed. On the other hand, vicinities of the ends of the silicon layer 114, which are spaced from the opening 122, the heat reservoir layer 118a have sufficient heat reservoir function. Accordingly, the end vicinities of the silicon layer 114 have lower cooling speed, whereby silicon polycrystals laterally grown and having large grain diameters can be formed in a wider region than in the second to the fifth embodiments.

Thus the silicon layer 114 is crystallized, and a polycrystal silicon thin film 114e is formed.

Next, the heat reservoir layer 118a is etched by RIE with the isolation film 116 as an etching stopper.

Next, the isolation film 116 is etched with an HF-based etchant (see FIG. 20).

Thus the polycrystal silicon thin film is formed by the present embodiment.

(Evaluation Result)

Figure 12D:
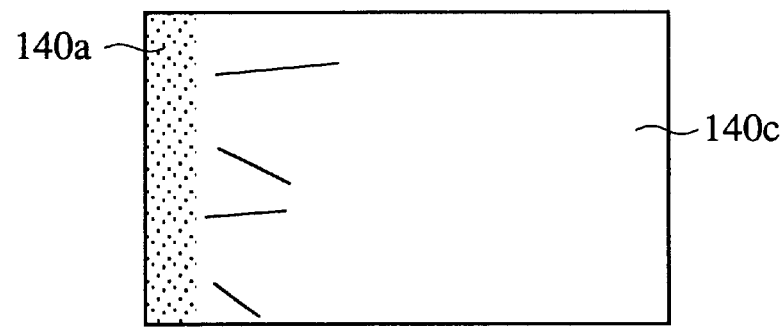

Next, crystal states of the polycrystal silicon thin film as described above will be explained with reference to FIG. 12D. FIG. 12D is conceptual views of the crystal states of the polycrystal silicon thin film formed by the present embodiment.

As shown in FIG. 12D, according to the present embodiment, the region where silicon polycrystals 140c laterally grown and having large grain diameters are formed is wider as shown in FIGS. 12A to 12C than in the first to the fourth embodiments. None of the silicon polycrystals 140b of large grain diameters observed in FIGS. 12A and 12B are observed in the present embodiment.

As described above, according to the present embodiment, because of the opening formed in the heat reservoir layer a temperature gradient takes place widely from the central part of the silicon layer to the ends thereof, whereby a polycrystal silicon thin film having silicon polycrystals of large grain diameters can be formed in a wide range.

[A Seventh Embodiment]

Figure 21:
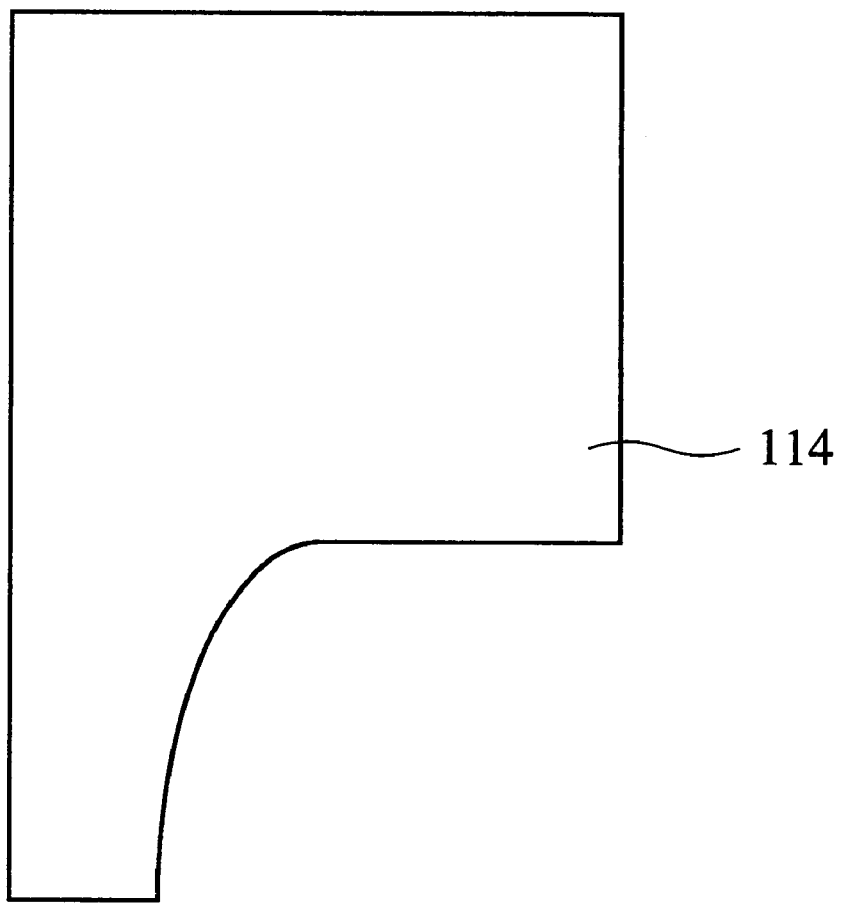
FIG. 21 is a plan view of the silicon layer, which show the polycrystal silicon thin film forming method according to a seventh embodiment of the present invention.
Figure 22:
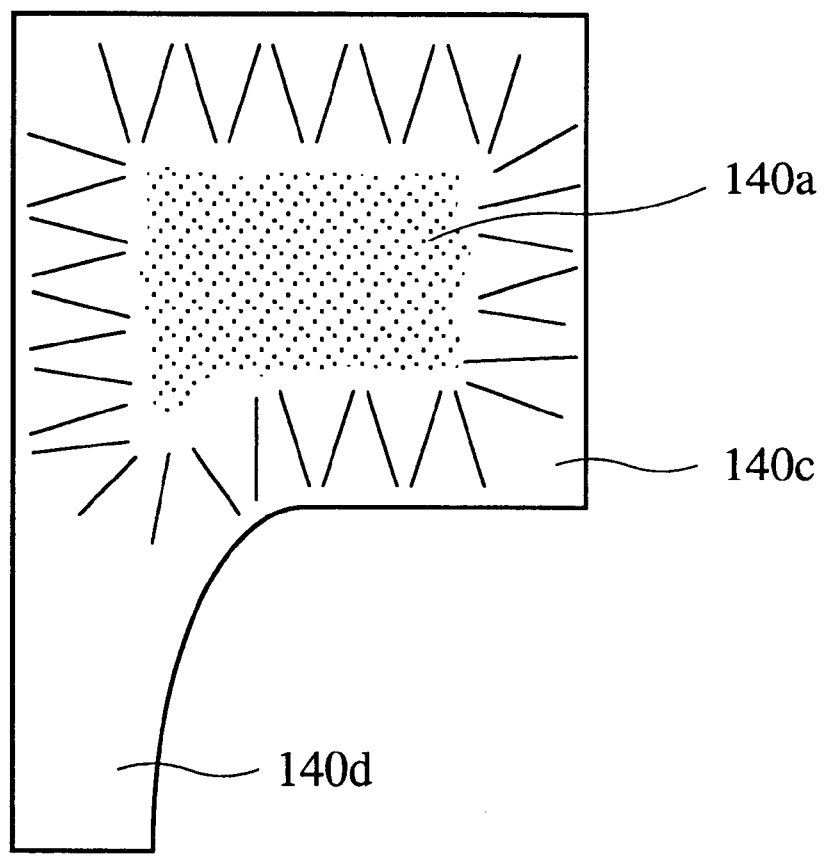
FIG. 22 is conceptual view of crystal states of the polycrystal silicon thin film.

The polycrystal silicon thin film forming method according to a seventh embodiment of the present invention will be explained with reference to FIGS. 21 and 22. FIG. 21 is a plan view of a polycrystal silicon thin film, which show the polycrystal silicon thin film forming method according to the present embodiment. FIG. 22 is a conceptual view of crystal states of the polycrystal silicon thin film formed by the present embodiment. The same members of the present embodiment as those of the polycrystal silicon thin film forming method according to the second to the sixth embodiments shown in FIGS. 8A to 20 are represented by the same reference numbers not to repeat or simplify their explanation.

The polycrystal silicon thin film forming method according to the present embodiment is characterized in that, as shown in FIG. 21, a silicon layer 114 does not have a rectangular plane shape, and is characterized by a partially reduced width.

The steps of the present embodiment up to the step of forming a heat reservoir layer 118a are the same of those of the polycrystal silicon thin film forming method according to the fifth embodiment, and their explanation is omitted. However, the polycrystal silicon thin film forming method according to the present embodiment is different from that according to the fifth embodiment in that, in the former, when the silicon layer 114 is patterned, the silicon pattern 114 is patterned in the plane shape as shown in FIG. 21. That is, in the present embodiment the silicon layer 114 has a partially reduced width. The silicon layer 114 can have, e.g., a 5 μm-width which is extended left to right as viewed in the drawing. The silicon layer 114 can have e.g., a 5 μm-length at the larger-width region, which is extended up to down as viewed in the drawing. The silicon layer 114 has a 100 nm-thickness as in the fifth embodiment.

Then, a glass substrate 110 is heated to 500° C., and short pulsed laser beams are applied on the side of the underside of the glass substrate 110, whereby the silicon layer 114 is crystallized.

Then, the heat reservoir layer 118a is etched by RIE with an isolation film 116 as an etching stopper.

Next, the isolation film 116 is etched with an HF-based etchant.

Thus, a polycrystal silicon thin film is formed by the present embodiment.

(Evaluation Result)

Then, crystal states of the polycrystal silicon thin film formed as described above will be explained with reference to FIG. 22.

As shown in FIG. 22, the central part of the silicon layer 114, which is in the larger-width region, is a tiny grain diameter-polycrystal silicon region 140a.

On the other hand, in vicinities of the ends of the silicon layer 114 in the larger width-region, silicon polycrystals 140c laterally grown and having large grain diameters are formed toward the ends in a wide range.

In a vicinity of a region between the larger-width region and the smaller-width region crystals laterally grew from one point inside the silicon layer toward the ends thereof, and the crystals are monocrystals.

In the smaller-width region the heat reservoir of the heat reservoir layer 118a is more effective, and crystals grow laterally downward as viewed in the drawing, and silicon monocrystals 140d are formed.

As described above, according to the present embodiment, the silicon layer is patterned to have a smaller width partially in a region, whereby silicon monocrystals can be formed in the smaller-width region of the silicon layer.

[An Eighth Embodiment]

The thin film transistor fabrication method according to an eighth embodiment of the present invention will be explained with reference to FIGS. 23A to 26B. FIGS. 23A to 26B are sectional views of a thin film transistor in the steps of the thin film transistor fabrication method according to the present embodiment, which show the process. The same members of the present embodiment as those of the polycrystal silicon thin film forming method according to the second to the seventh embodiments shown in FIGS. 8A to 22 are represented by the same reference numbers not to repeat or to simplify their explanation.

The thin film transistor fabrication method according to the present embodiment is characterized mainly in that the polycrystal silicon thin film formed by the second to the seventh embodiments is used as the channel layer of the thin film transistor.

First, a polycrystal silicon thin film is formed by the polycrystal silicon thin film forming method according to any one of the second to the seventh embodiments. Here, the channel layer 124 is formed of a polycrystal silicon thin film of a 3 μm-length and a 5 μm-width formed by the polycrystal silicon thin film 114e forming method according to the fifth embodiment (see FIG. 23A).

Next, a gate oxide film 126 of a 120 nm-thickness silicon oxide film is formed on the entire surface by PECVD. The gate oxide film 126 may be formed by LP (Low Pressure) CVD, sputtering or others (see FIG. 23B).

Figure 23A:
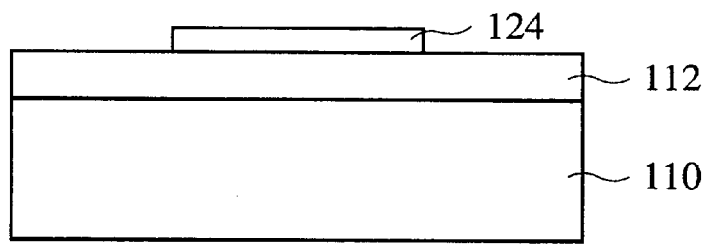
FIGS. 23A to 23C are sectional views of a thin film transistor in the steps of the thin film transistor fabrication method according to a eighth embodiment of the present invention (Part 1).
Figure 23B:
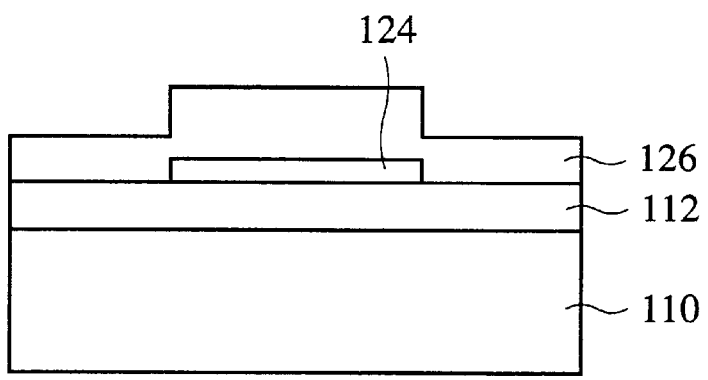
Figure 23C:
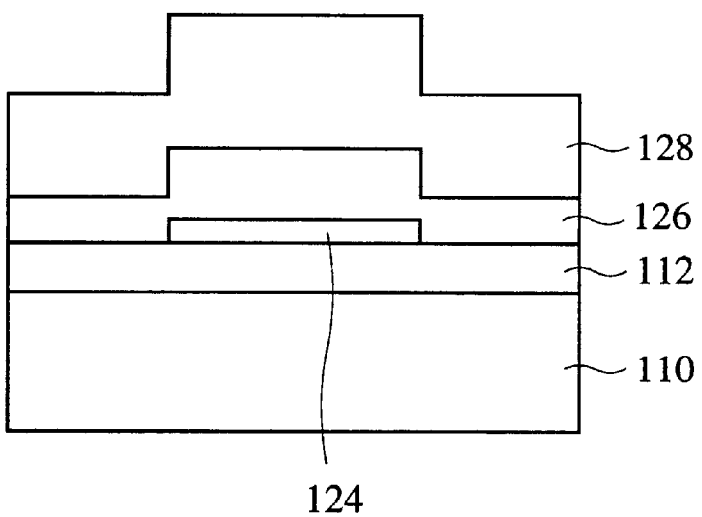

Next, a 300 nm-thickness aluminum layer 128 is formed on the entire surface by sputtering (see FIG. 23C).

Figure 24A:
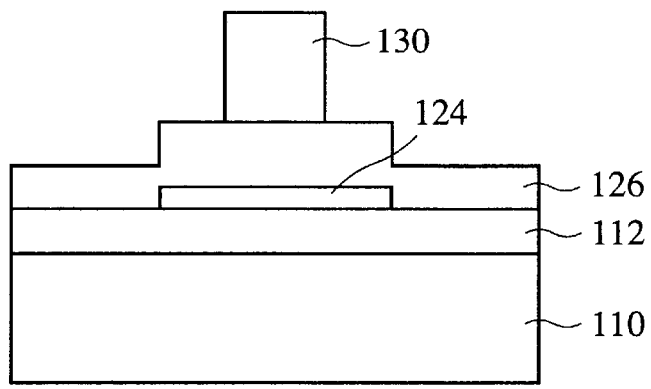
FIGS. 24A to 24C are sectional views of the thin film transistor in the steps of the thin film transistor fabrication method according to the eighth embodiment of the present invention (Part 2).

Then, the aluminum layer 128 is patterned into a configuration of a gate electrode 130 by photolithography (see FIG. 24A).

Figure 24B:
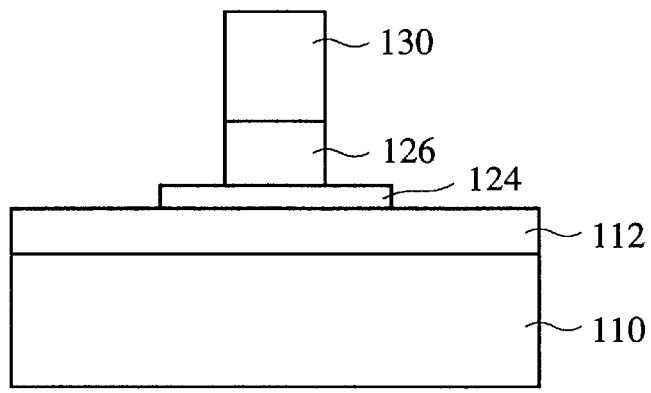
Figure 24C:
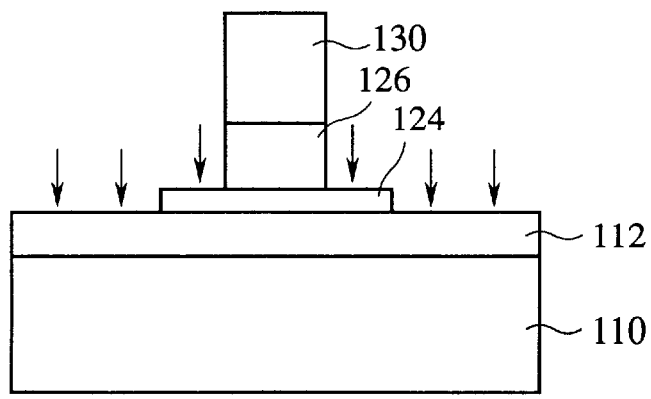

Then, the gate oxide film 126 is etched by self-alignment with the gate electrode 130 (see FIG. 24B).

Then, dopant ions are implanted in the channel layer 124 by self-alignment with the gate electrode 130. A dopant can be, e.g., phosphorus.

Then, excimer laser beams are applied on the side of the upper surface of the glass substrate 110 to activate the dopant implanted in the channel layer 124. Thus a source/drain diffusion layer 132 is formed by self-alignment with the gate electrode 130 (see FIG. 25A).

Figure 25A:
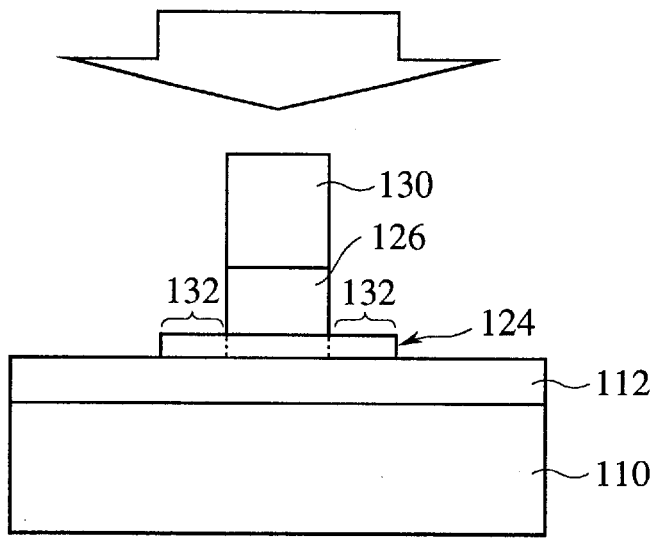
FIGS. 25A and 25B are sectional views of the thin film transistor in the steps of the thin film transistor fabrication method according to the eighth embodiment of the present invention (Part 3).
Figure 25B:
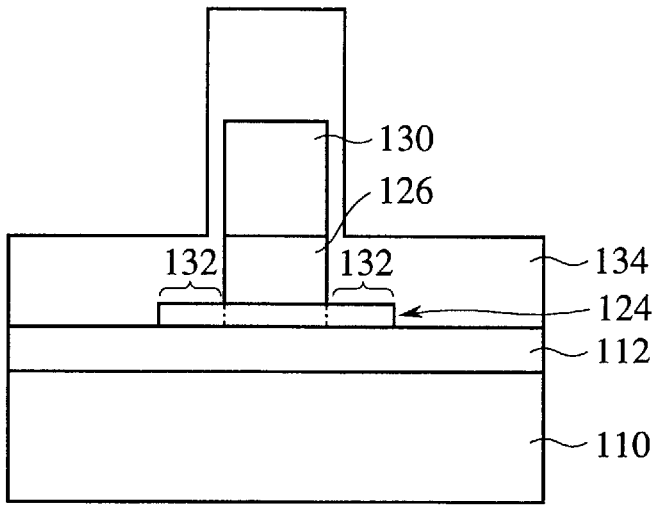
Figure 26:
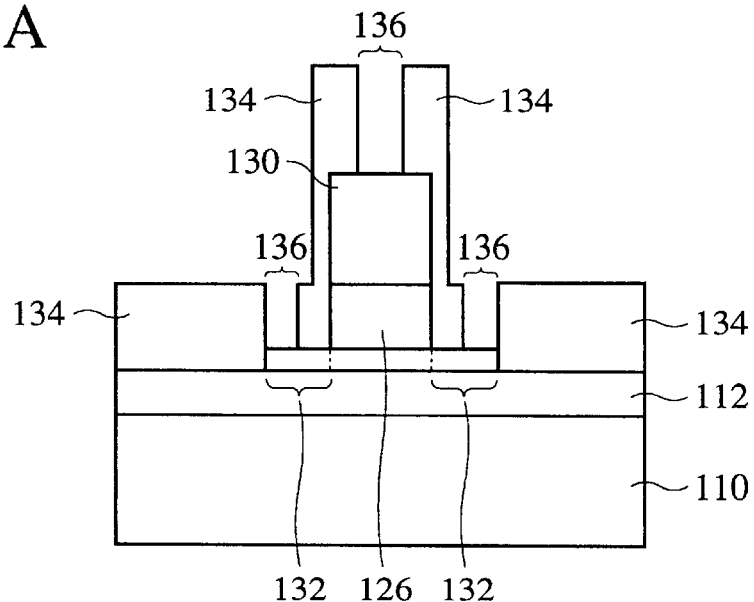
FIGS. 26A and 26B are sectional views of the thin film transistor in the steps of the thin film transistor fabrication method according to the eighth embodiment of the present invention (Part 4).
Figure 26:
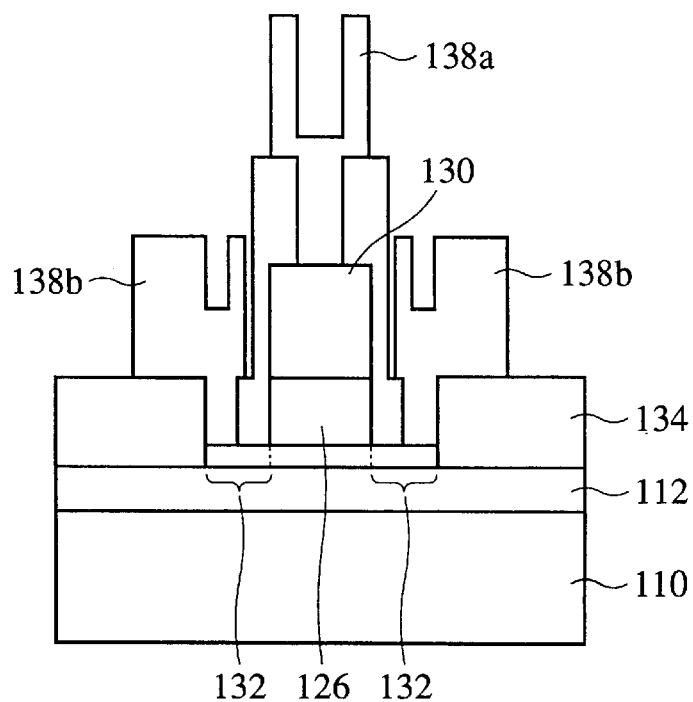

Next, an inter-layer insulation film 134 of an 300 nm-thickness SiN film is formed on the entire surface (FIG. 25B).

Then, contact holes 136 respectively reaching the source/drain diffusion layer 132 and the gate electrode 130 are formed in the inter-layer insulation film 134.

Subsequently, a conducting layer of a 100 nm-thickness Ti film, a 200 nm-thickness Al film and a 100 nm-thickness Ti film laid on one another on the entire surface is formed.

Next, the conducting layer is patterned by photolithography, and a gate electrode 138a and a source/drain electrode 138b of the conducting layer are formed.

Thus, a thin-film transistor according to the present embodiment is fabricated.

(Evaluation Result)

Next, electron mobility of the thus-fabricated thin film transistor was measured.

As a result the electron mobility could have a high value of 300 $cm^2/Vs$.

As described above, according to the present embodiment, a polycrystal silicon thin film having large grain diameters formed as described above is used as the channel layer, whereby the thin film transistor can have high electron mobility.

[Modifications]

The present invention is not limited to the above-described embodiment and can cover various modifications.

In the first embodiment a laser beam is applied in pulses while the high-temperature inert gas is being flowed, but a timing of applying a laser beam is not limited to that of the first embodiment. As long as a low solidification rate of a melted semiconductor thin film can be provided, it is possible that a laser beam is applied to in pulses, e.g., immediately after the flow of the high-temperature inert gas is finished. A low solidification rate of the semiconductor thin film can be obtained immediately after the flow of the high-temperature inert gas is finished, because the semiconductor thin film and its vicinity are kept at high temperature by the high-temperature inert gas, whereby the polycrystal thin film can have good quality.

In the first embodiment silicon thin film of an 70 nm-thickness is used, but a thickness of the silicon film thickness is not limited to 70 nm and may be set suitably in a range of, e.g., 30–100 nm.

In the first embodiment, the inert gas is heated to 600° C. and is flowed to a substrate, but a temperature of the inert gas is not limited to 600° C. and can be suitably set in a range of, e.g., 500° C.–3000° C., preferably in a range of 600° C.–2000° C.

In the first embodiment, a gas applied to the semiconductor thin film on the substrate is argon gas but is not limited to argon gas. A gas other than argon gas, e.g., nitrogen gas may be used as long as it does not deteriorate characteristics of the semiconductor thin film.

In the first embodiment, the silicon thin film formed on the substrate is amorphous silicon film but is not limited to amorphous silicon film. For example, silicon thin film, such as polycrystal silicon thin film, microcrystal or nanocrystal silicon thin film or others may be used.

In the first embodiment, it is preferable to suitably set a frequency for flowing the high-temperature inert gas in pulses, a frequency for applying a laser beam in pulses, a timing of flowing the inert gas and applying a laser beam, a period of time of flowing the high-temperature inert gas, a flow rate of the high-temperature inert gas, a kind of the high-temperature inert gas, a temperature of the high-temperature inert gas, a speed of moving the glass substrate on the X-Y stage, and a positional relationship between the port and a laser beam. These parameters are optimized to thereby form high-quality polycrystal silicon thin film.

In the first embodiment, the substrate is not heated, but the substrate is heated to thereby decrease solidification rate of the melted semiconductor thin film. The melted semiconductor thin film has further decreased solidification rate, whereby crystal grain diameter can be made larger.

In the first embodiment an area of the silicon thin film for a laser beam to be applied to is made large, whereby polycrystal silicon thin film can be formed more efficiently.

In the first embodiment, laser beams are used as an energy beam, but the energy beam is not limited to laser beams and can be, e.g., electron beams or others as long as the energy beams can melt the semiconductor thin film.

In the first embodiment, the substrate is provided by a glass substrate, but the substrate is not limited to a glass substrate and can be a transparent substrate, as of quartz, sapphire or others.

The first embodiment has been explained by means of an example of forming polycrystal silicon thin film, but the present invention is applicable to forming polycrystal germanium thin film or polycrystal silicon germanium alloy thin film. In this case, germanium thin film or silicon germanium alloy thin film is formed on a substrate in advance.

For example, in the second to the eighth embodiments, the heat reservoir layer covers the silicon layer, but the heat reservoir layer may be formed partially on the silicon layer.

In the eighth embodiment, a thin film transistor is fabricated, but polycrystal silicon thin films formed by the second to the seventh embodiments are applicable to any use.

A thin-film transistor fabricated by the eighth embodiment is applicable to any use, e.g., TFT-LCDs including integrated peripheral circuits, system-on-panels, system-on-glasses, etc.

In the second to the eighth embodiments, the short pulsed laser is provided by an excimer laser, but not only excimer lasers but also any short pulsed laser can be used.

In the second to the eighth embodiments, the silicon layer is an amorphous silicon layer, but not only amorphous silicon layer but also polycrystal silicon layer, micro-crystal silicon layer, etc., for example, may be used.

In the second to the eighth embodiments, the isolation film is provided by silicon oxide film, but not only silicon oxide film but also silicon nitride film, insulation film containing silicon, etc. may be used as long as they are not melted by laser beam application.

In the second to the eighth embodiments, the heat reservoir layer is unessentially provided by polycrystal silicon layer and may be any film as long as the film is heat-insulative.

In the second to the eighth embodiments, the heat reservoir layer is formed by PECVD, but PECVD is not essential. Any other CVD may be used. The heat reservoir layer may be formed by PVC (Physical Vapor Deposition).

In the second to the eighth embodiments, the heat reservoir layer is formed of polycrystal silicon layer formed by solid-phase growth using Ni. Metal catalysts other than Ni may be used. Other metal catalysts can be, e.g., Cu, Au, Pt, Pd, Al, etc., which are effective to crystallize amorphous silicon. A plurality of metal catalysts may be implanted in the heat reservoir layer. Group III dopants and group V dopants may be suitably implanted in the heat reservoir layer.

In the second to the eighth embodiments, the heat reservoir layer is provided by polycrystal silicon layer or others but may be provided by a metal.

In the second to the eighth embodiments, the isolation film is formed. However, the isolation film is not formed, and a first insulation layer which is not melted by short pulsed laser beams may be formed on the silicon layer. A second insulation layer may be formed on the first insulation layer. The second heat reservoir may be a silicon oxide film, silicon nitride film or others.

In the second to the eighth embodiments, the silicon layer is crystallized by applying laser beams on the side of the underside of the glass substrate, but the silicon layer may be crystallized by applying laser beams on the side of the upper surface of the glass substrate, i.e., from above the heat reservoir layer. In the case, it is preferable that the heat reservoir layer is not absorptive of laser beams.

In the second to the eighth embodiments, the silicon layer has 50 nm-thickness and 100 nm-thickness but is not limited to these thicknesses. The silicon layer may have a suitable thickness, e.g., a thickness of above 20 nm and below 300 nm.

In the sixth embodiment, the opening is formed partially in the heat reservoir layer on the silicon layer, but instead the heat reservoir layer may have a configuration suitable to form a silicon layer having required crystallization.

In the seventh embodiment, the silicon layer as shown in FIG. 21 is formed but may have any configuration. For example, the smaller-width region may have a suitable shape so that required crystals can be grown in the smaller-width region.

In the second to the eighth embodiments, the laser beam application is performed with the substrate set at the room temperature, 300° C. and 500° C., but the substrate may be heated to a temperature of a range in which the substrate is not deformed.

In the second to the eighth embodiments, preferably the glass substrate is provided by a glass substrate having a high deformation point. A glass substrate having a high deformation point of, e.g., about 600° C.–700° C. can be used.

In the second to the eighth embodiments, the glass substrate is used, but a substrate, such as quartz glass substrate or others, which is laser-beam permeable may be suitably used.

It is possible to set a thickness of the buffer layer suitably to form required crystals in the silicon layer.

In the second to the eighth embodiments, the buffer layer is provided by a silicon oxide film but is not limited to silicon oxide film. The buffer layer may be formed of, e.g., silicon nitride film or others.

A configuration of the silicon layer is not limited to the configurations of the second to the eighth embodiments. It is preferable that the silicon layer is suitably formed in a required configuration.

It is possible that a polycrystal silicon thin film is formed by crystalizing the silicon layer and is further patterned into a required configuration.

What is claimed is:

1. A polycrystal thin film forming method comprising the steps of:

forming a semiconductor thin film on a substrate; and flowing a heated gas to the semiconductor thin film while applying an energy beam to the semiconductor thin film to melt the semiconductor thin film at a region to which the gas is being flowed, and crystallizing the semiconductor thin film by solidification to form a polycrystal thin film.

2. A polycrystal thin film forming method according to claim 1, wherein a temperature of the gas is 500° C.–3000° C.

3. A polycrystal thin film forming method according to claim 1, wherein in the step of forming the polycrystal thin film, the energy beam is applied in pulses while the gas is being flowed in pulses.

4. A polycrystal thin film forming method according to claim 1, wherein in the step of forming the polycrystal thin film, the substrate is mounted in a chamber having a reduced pressure, and the gas flows into the chamber through a port positioned near the substrate to be applied to the semiconductor thin film.

5. A polycrystal thin film forming method according to claim 4, wherein in the step of forming the polycrystal thin film, a position of the substrate with respect to the port is gradually replaced to gradually form the polycrystal thin film.

6. A polycrystal thin film forming method according to claim 1, wherein in the step of forming the polycrystal thin film, the gas starts to be flowed earlier than the energy beam starts to be applied, and a period of time of flowing the gas is longer than a period of time of applying the energy beam.

7. A polycrystal thin film forming method according to claim 1, wherein in the step of forming the polycrystal thin film, at least the gas is being flowed while the energy beam is being applied.

8. A thin film transistor fabricating method comprising the steps of:

forming a semiconductor thin film on a substrate; and applying an energy beam to the semiconductor thin film to melt the semiconductor thin film while flowing a heated gas to the semiconductor thin film, and crystallizing the semiconductor thin film by solidification to form a polycrystal thin film.

9. A thin film transistor fabricating method according to claim 8, wherein a temperature of the gas is 500° C.–3000° C.

10. A thin film transistor fabricating method according to claim 8, wherein in the step of forming the polycrystal thin film, the energy beam is applied in pulses while the gas is being flowed in pulses.

* * * * *